US012080701B2

United States Patent
Kim

(10) Patent No.: US 12,080,701 B2
(45) Date of Patent: Sep. 3, 2024

(54) SEMICONDUCTOR PACKAGE

(71) Applicant: SAMSUNG ELECTRONICS CO., LTD., Suwon-si (KR)

(72) Inventor: Sanguk Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/210,132

(22) Filed: Jun. 15, 2023

(65) Prior Publication Data
US 2023/0326916 A1    Oct. 12, 2023

Related U.S. Application Data

(63) Continuation of application No. 17/225,375, filed on Apr. 8, 2021, now Pat. No. 11,728,323.

(30) Foreign Application Priority Data

Sep. 10, 2020    (KR) .................. 10-2020-0116095

(51) Int. Cl.
*H01L 25/18*    (2023.01)
*H01L 23/00*    (2006.01)
(Continued)

(52) U.S. Cl.
CPC .......... *H01L 25/18* (2013.01); *H01L 23/3128* (2013.01); *H01L 23/49816* (2013.01);
(Continued)

(58) Field of Classification Search
CPC ................ H01L 25/18; H01L 23/3128; H01L 23/49816; H01L 23/49822; H01L 23/5386;
(Continued)

(56) References Cited

U.S. PATENT DOCUMENTS

| 10,020,272 B2 | 7/2018 | Lee et al. |
| 10,396,037 B2 | 8/2019 | Hwang et al. |

(Continued)

FOREIGN PATENT DOCUMENTS

| CN | 111199947 A | 5/2020 |
| CN | 111223832 A | 6/2020 |

(Continued)

OTHER PUBLICATIONS

First Office Action dated Apr. 19, 2024 for corresponding Application No. TW 110122059.

*Primary Examiner* — Douglas W Owens
(74) *Attorney, Agent, or Firm* — Muir Patent Law, PLLC

(57) ABSTRACT

A semiconductor package includes a package substrate, first and second bumps on a lower surface of the package substrate, a semiconductor chip on an upper surface of the package substrate, first and second connection patterns on the upper surface of the package substrate, a molding on the upper surface of the package substrate and covering the semiconductor chip, a warpage control layer on the molding, an upper insulating layer on the warpage control layer, a first opening passing through the upper insulating layer and exposing an upper surface of the warpage control layer, a second opening overlapping the first opening in a top view, the second opening passing through the warpage control layer and exposing the first connection pattern, and a third opening passing through the upper insulating layer and exposing the second connection pattern.

20 Claims, 26 Drawing Sheets

(51) Int. Cl.
  *H01L 23/31* (2006.01)
  *H01L 23/498* (2006.01)
  *H01L 23/538* (2006.01)

(52) U.S. Cl.
  CPC .. *H01L 23/49822* (2013.01); *H01L 23/49833* (2013.01); *H01L 23/49838* (2013.01); *H01L 23/5385* (2013.01); *H01L 23/5386* (2013.01); *H01L 24/06* (2013.01); *H01L 24/73* (2013.01); *H01L 2224/0401* (2013.01); *H01L 2224/06515* (2013.01); *H01L 2224/16146* (2013.01); *H01L 2224/16148* (2013.01); *H01L 2224/16235* (2013.01); *H01L 2224/16238* (2013.01); *H01L 2224/73204* (2013.01); *H01L 2924/1431* (2013.01); *H01L 2924/1434* (2013.01); *H01L 2924/3511* (2013.01)

(58) Field of Classification Search
  CPC . H01L 24/06; H01L 24/73; H01L 2224/0401; H01L 2224/06515; H01L 2224/16146; H01L 2224/16148; H01L 2224/16235; H01L 2224/16238; H01L 2224/73204; H01L 2924/3511; H01L 2225/06541
  See application file for complete search history.

(56) References Cited

U.S. PATENT DOCUMENTS

| | | | |
|---|---|---|---|
| 10,468,355 | B2 | 11/2019 | Wu et al. |
| 10,553,569 | B2 | 2/2020 | Yu et al. |
| 10,573,613 | B2 | 2/2020 | Kim et al. |
| 10,790,239 | B2 | 9/2020 | Lim et al. |
| 10,867,982 | B1* | 12/2020 | Yu .................. H01L 25/167 |
| 2018/0277492 | A1 | 9/2018 | Li et al. |
| 2019/0333870 | A1 | 10/2019 | Chen et al. |
| 2020/0051918 | A1* | 2/2020 | Bae .................. H01L 24/17 |
| 2020/0168537 | A1* | 5/2020 | Bae .................. H01L 23/49838 |
| 2021/0320067 | A1 | 10/2021 | Kim et al. |
| 2022/0310777 | A1 | 9/2022 | O'Sullivan et al. |
| 2022/0320019 | A1* | 10/2022 | Chang .................. H01L 23/145 |

FOREIGN PATENT DOCUMENTS

| | | |
|---|---|---|
| KR | 10-1982044 B1 | 5/2019 |
| KR | 10-2052899 B1 | 12/2019 |
| KR | 10-2020-0030304 A | 3/2020 |
| TW | 201919190 A | 5/2019 |

\* cited by examiner

SEMICONDUCTOR PACKAGE

CROSS-REFERENCE TO RELATED APPLICATION

This is a continuation of U.S. patent application Ser. No. 17/225,375 filed Apr. 8, 2021, which is incorporated by reference herein in its entirety.

Korean Patent Application No. 10-2020-0116095, filed on Sep. 10, 2020, in the Korean Intellectual Property Office, and entitled: "Semiconductor Package," is incorporated by reference herein in its entirety.

BACKGROUND

1. Field

Embodiments relate to a semiconductor package. More specifically, embodiments relate to a semiconductor package including a warpage control layer.

2. Description of the Related Art

Materials included in the semiconductor package may be heated and cooled during the manufacture of the semiconductor package. The materials included in the semiconductor package may have different coefficients of thermal expansion (CTEs), and differences in CTE may cause deformation or warpage of the semiconductor package during the heating and cooling of the semiconductor package. It may be necessary to control the warpage of the semiconductor package.

SUMMARY

According to embodiments, there is provided a semiconductor package including a package substrate, a first bump and a second bump on a lower surface of the package substrate, a semiconductor chip on an upper surface of the package substrate, a first connection pattern and a second connection pattern on the upper surface of the package substrate, molding on the upper surface of the package substrate to cover the semiconductor chip, a warpage control layer on the molding, an upper insulating layer on the warpage control layer, a first opening passing through the upper insulating layer and exposing an upper surface of the warpage control layer, a second opening overlapping the first opening in a view from above, passing through the warpage control layer, and exposing the first connection pattern, and a third opening passing through the upper insulating layer and exposing the second connection pattern.

According to embodiments, there is provided a semiconductor package including a first sub-package and a second sub-package on the first sub-package. The first sub-package includes a first package substrate, a first ground bump on a lower surface of the first package substrate, a first semiconductor chip on an upper surface of the first package substrate, a ground connection pattern located on the upper surface of the first package substrate and connected to the first ground bump through the first package substrate, a first molding on the upper surface of the first package substrate to cover the first semiconductor chip, a warpage control layer on the first molding, and an upper insulating layer on the warpage control layer. The second sub-package includes a second package substrate, a second ground bump on a lower surface of the second package substrate, a second semiconductor chip on an upper surface of the second package substrate, and a second molding on the upper surface of the second package substrate to cover the second semiconductor chip. The second ground bump is in contact with the warpage control layer and the ground connection pattern through a first opening passing through the upper insulating layer and a second opening passing through the warpage control layer and the first molding.

According to embodiments, there is provided a semiconductor package including a first sub-package and a second sub-package on the first sub-package. The first sub-package includes a redistribution structure, a first ground bump and a first signal bump on a lower surface of the redistribution structure, a first semiconductor chip on an upper surface of the redistribution structure, a frame located on the upper surface of the redistribution structure and including a ground connection pattern connected to the first ground bump, a signal connection pattern connected to the first signal bump, and an insulating structure surrounding the ground connection pattern and the signal connection pattern, a first molding on the first semiconductor chip and the frame, a warpage control layer on the first molding, and an upper insulating layer on the warpage control layer. The second sub-package includes a package substrate, a second ground bump and a second signal bump on a lower surface of the package substrate, a second semiconductor chip on an upper surface of the package substrate, and a second molding on the upper surface of the package substrate, the second molding covering the second semiconductor chip. The second ground bump is in contact with the warpage control layer and the ground connection pattern through a first opening passing through the upper insulating layer and a second opening passing through the warpage control layer and the first molding. The second signal bump is in contact with the signal connection pattern through a third opening passing through the upper insulating layer and the first molding and is separated from the warpage control layer.

According to embodiments, there is provided a semiconductor package including a redistribution structure a ground bump and a signal bump on a lower surface of the redistribution structure, a frame located on an upper surface of the redistribution structure and including a ground connection pattern electrically connected to the ground bump and a signal connection pattern electrically connected to the signal bump, an application processor (AP) chip inside a hole configured to pass through the frame, molding on the upper surface of the redistribution structure to cover the AP chip and the frame, a copper (Cu) layer on the molding, an upper insulating layer on the copper layer, a first opening passing through the upper insulating layer and exposing an upper surface of the copper layer, a second opening overlapping the first opening in a view from above, passing through the copper layer, and exposing the ground connection pattern, and a third opening passing through the upper insulating layer and exposing the signal connection pattern.

According to embodiments, there is provided a semiconductor package including a first sub-package and a second sub-package on the first sub-package. The first sub-package includes a redistribution structure, a first ground bump on a lower surface of the redistribution structure, a logic chip on an upper surface of the redistribution structure, a frame on the upper surface of the redistribution structure to surround the logic chip, a first molding on the upper surface of the redistribution structure to cover the logic chip and the frame, a dummy copper layer on the first molding, an upper insulating layer on the dummy copper layer, a first opening passing through the upper insulating layer and exposing the dummy copper layer, and a second opening overlapping the first opening in a view from above, passing through the dummy copper layer, and exposing the frame. The second sub-package includes a second package substrate, a second ground bump on a lower surface of the second package substrate, a memory chip on an upper surface of the second package substrate, and a second molding on the upper surface of the second package substrate, the second molding covering the memory chip. The second ground bump is in contact with the dummy copper layer and the frame through the first opening and the second opening.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
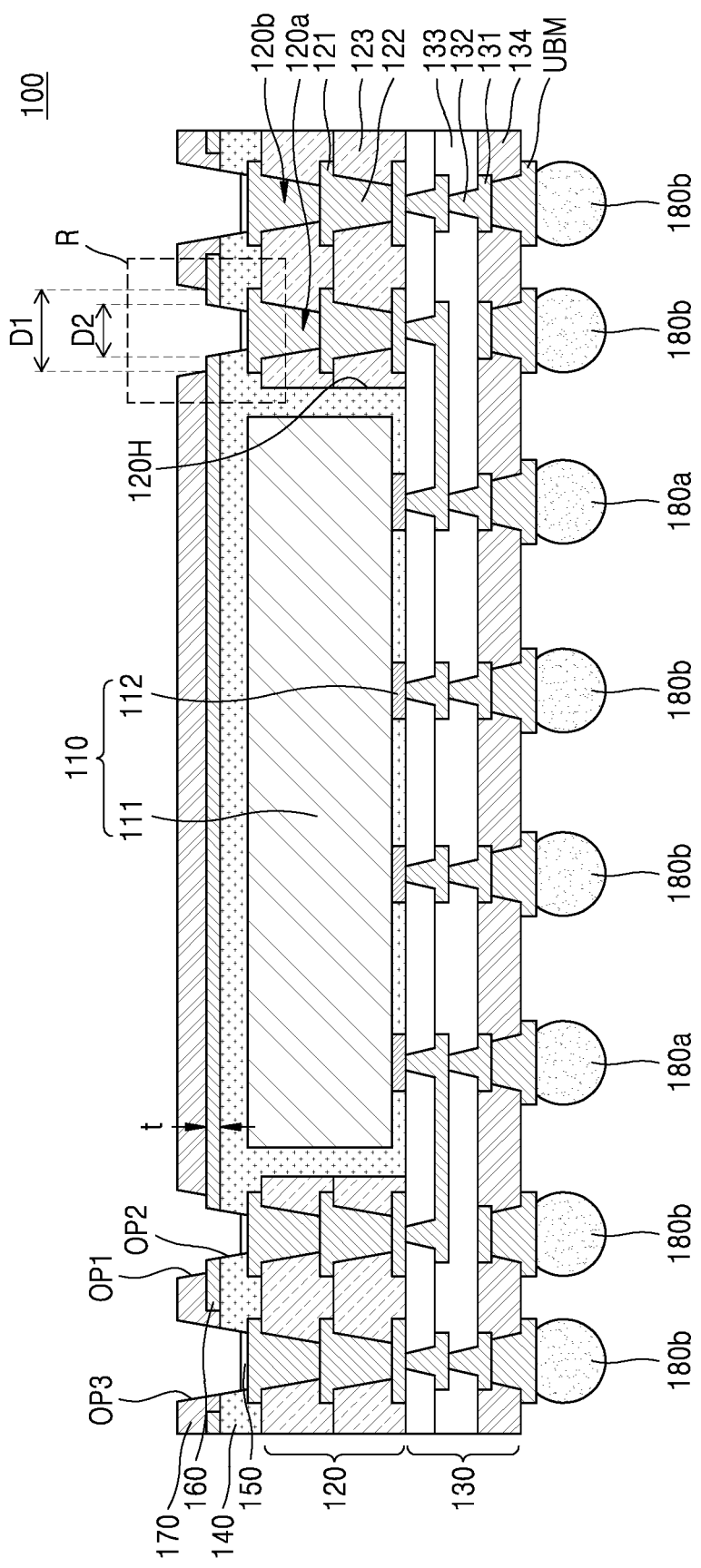
FIG. 1A is a cross-sectional view of a semiconductor package according to an embodiment.
Figure 1B:
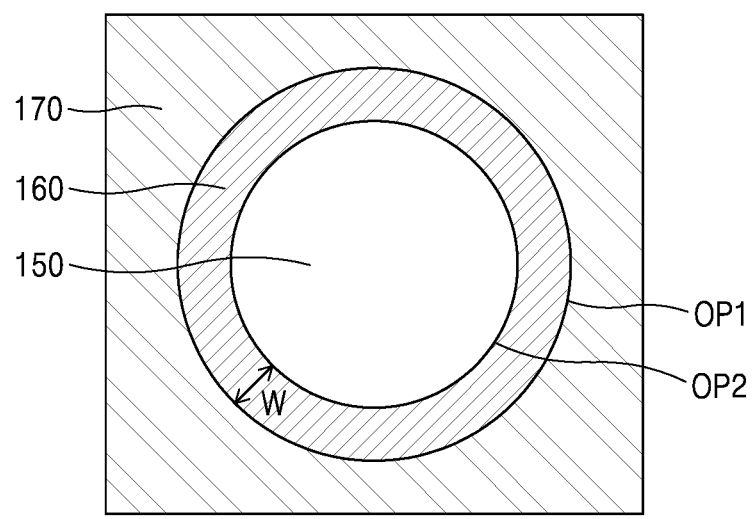
FIG. 1B is an enlarged plan view of region R of FIG. 1A.

FIG. 1A is a cross-sectional view of a semiconductor package 100 according to an embodiment. FIG. 1B is an enlarged plan view of region R of FIG. 1A.

Referring to FIGS. 1A and 1B, the semiconductor package 100 may include a first package substrate 130, a first ground bump 180a, a first signal bump 180b, a first semiconductor chip 110, a ground connection pattern 120a, a signal connection pattern 120b, a first molding 140, a warpage control layer 160, an upper insulating layer 170, a first opening OP1, a second opening OP2, and a third opening OP3. In some embodiments, the semiconductor package 100 may be a panel-level package (PLP).

The first package substrate 130 may connect the first semiconductor chip 110 to the first ground bump 180a, connect the first semiconductor chip 110 to the first signal bump 180b, connect the first semiconductor chip 110 to the ground connection pattern 120a, connect the first semiconductor chip 110 to the signal connection pattern 120b, connect the signal connection pattern 120b to the first signal bump 180b, and connect the ground connection pattern 120a to the first ground bump 180a. In some embodiments, the first package substrate 130 may have a redistribution structure. In other embodiments, the first package substrate 130 may include a printed circuit board (PCB).

The first package substrate 130 may include a first substrate insulating layer 133, a first substrate conductive pattern 131 on a lower surface of the first substrate insulating layer 133, a first substrate conductive via 132 configured to pass through the first substrate insulating layer 133 and come into contact with the first substrate conductive pattern 131, and a first substrate protective layer 134 covering a lower surface of the first substrate conductive pattern 131 and the lower surface of the first substrate insulating layer 133. The plurality of first substrate conductive patterns 131 and the plurality of first substrate conductive vias 132 may form electrical paths. For example, the plurality of first substrate conductive patterns 131 and the plurality of first substrate conductive vias 132 may form an electrical path configured to connect the first semiconductor chip 110 to the first ground bump 180a, an electrical path configured to connect the first semiconductor chip 110 to the first signal bump 180b, an electrical path configured to connect the first semiconductor chip 110 to the ground connection pattern 120a, an electrical path configured to connect the first semiconductor chip 110 to the signal connection pattern 120b, an electrical path configured to connect the signal connection pattern 120b to the first signal bump 180b, and an electrical path configured to connect the ground connection pattern 120a to the first ground bump 180a.

The first substrate insulating layer 133 may include, e.g., an inorganic insulating material, an organic insulating material, or a combination thereof. The inorganic insulating material may include, e.g., silicon oxide, silicon nitride, or a combination thereof. The organic insulating material may include, e.g., polyimide, an epoxy resin, or a combination thereof. The first substrate conductive pattern 131 and the first substrate conductive via 132 may include, e.g., a conductive material including copper (Cu), gold (Au), silver (Ag), nickel (Ni), tungsten (W), aluminum (Al), or a combination thereof. In some embodiments, the first substrate conductive pattern 131 and the first substrate conductive via 132 may further include a barrier material to prevent the diffusion of the conductive material into the first substrate insulating layer 133. The barrier material may include, e.g., titanium (Ti), tantalum (Ta), titanium nitride (TiN), tantalum nitride (TaN), or a combination thereof.

The first substrate protective layer 134 may physically and/or chemically protect the first package substrate 130 from the environment. In some embodiments, the first substrate protective layer 134 may include a composite material. That is, the first substrate protective layer 134 may include a matrix and filler in the matrix. The matrix may include, e.g., a polymer, and the filler may include, e.g., silica, titania, or a combination thereof. In some embodiments, the first substrate protective layer 134 may be formed using a build-up film, e.g., an ajinomoto build-up film (ABF). In some embodiments, a diameter of a lower end of the first substrate conductive via 132 may be greater than a diameter of an upper end thereof.

The first package substrate 130 may further include an under-bump metal UBM, which is on the first substrate protective layer 134 and in contact with the first substrate conductive pattern 131. In some embodiments, the under-bump metal UBM may include at least one of, e.g., an adhesive layer, a barrier layer, a wetting layer, and an anti-oxidation layer. The adhesive layer may include, e.g., chromium (Cr), titanium (Ti), nickel (Ni), tungsten (W), or a combination thereof. The barrier layer may include, e.g., chromium, tungsten, titanium, and/or nickel. The wetting layer may include, e.g., copper (Cu), nickel (Ni), platinum (Pt), palladium (Pd), or a combination thereof. The antioxidation layer may include, e.g., gold (Au).

The first ground bump 180a may be on a lower surface of the under-bump metal UBM. The first ground bump 180a may be grounded. The first ground bump 180a may provide a ground signal from the outside to the first semiconductor chip 110 and the ground connection pattern 120a. The first ground bump 180a may include, e.g., a conductive material including tin (Sn), lead (Pb), silver (Ag), copper (Cu), or a combination thereof. The first ground bump 180a may be formed using, e.g., a solder ball.

The first signal bump 180b may be on the lower surface of the under-bump metal UBM. The first signal bump 180b may provide a signal from the outside to the first semiconductor chip 110 and the signal connection pattern 120b or receive a signal from the first semiconductor chip 110 and the signal connection pattern 120b. The first signal bump 180b may include, e.g., a conductive material including tin, lead, silver, copper, or a combination thereof. The first signal bump 180b may be formed using, e.g., a solder ball.

The first semiconductor chip 110 may be on an upper surface of the first package substrate 130. The first semiconductor chip 110 may include a first body 111 and a first chip pad 112 on a lower surface of the first body 111. The first body 111 may include a substrate and an integrated circuit (IC) on the substrate. A surface of the first semiconductor chip 110 on which the IC is formed may be called an active surface, while a surface of the first semiconductor chip 110 opposite to the active surface may be called an inactive surface. In FIG. 1A, the active surface of the first semiconductor chip 110 may be a lower surface of the first semiconductor chip 110, i.e., a surface facing the first package substrate 130 and having the first chip pad 112 thereon, and the inactive surface of the first semiconductor chip 110 may be an upper surface of the first semiconductor chip 110.

The substrate of the first body 111 may include a semiconductor material, e.g., a Group-IV semiconductor material, a Group III-V semiconductor material, a Group II-VI semiconductor material, or a combination thereof. The Group-IV semiconductor material may include, e.g., silicon (Si), germanium (Ge), or a combination thereof. The Group III-V semiconductor material may include, e.g., gallium arsenide (GaAs), indium phosphide (InP), gallium phosphide (GaP), indium arsenide (InAs), indium antimonide (InSb), indium gallium arsenide (InGaAs), or a combination thereof. The Group II-VI semiconductor material may include, e.g., zinc telluride (ZnTe), cadmium sulfide (CdS), or a combination thereof.

The IC of the first body 111 may be any suitable type of IC including a memory circuit, a logic circuit, or a combination thereof. The memory circuit may include, e.g., a dynamic random access memory (DRAM) circuit, a static RAM (SRAM) circuit, a flash memory circuit, an electrically erasable and programmable read-only memory (EEPROM) circuit, a phase-change RAM (PRAM) circuit, a magnetic RAM (MRAM) circuit, a resistive RAM (RRAM) circuit, or a combination thereof. The logic circuit may include, e.g., a central processing unit (CPU) circuit, a graphics processing unit (GPU) circuit, a controller circuit, an application specific integrated circuit (ASIC) circuit, an application processor (AP) circuit, or a combination thereof.

The IC of the first body 111 may be connected to the first package substrate 130, e.g., via the first chip pad 112. The first chip pad 112 may include, e.g., a conductive material including copper, gold, silver, nickel, tungsten, aluminum, or a combination thereof.

The ground connection pattern 120a may be located on the first package substrate 130 and connected to the first ground bump 180a through the first package substrate 130. The ground connection pattern 120a and the first ground bump 180a may be configured to be grounded. The ground connection pattern 120a may include a plurality of conductive patterns 121 and a plurality of conductive vias 122 between the conductive patterns 121.

The signal connection pattern 120b may be located on the first package substrate 130 and connected to the first signal bump 180b through the first package substrate 130. The signal connection pattern 120b and the first signal bump 180b may transmit signals, e.g., other than a ground signal. The signal connection pattern 120b may include a plurality of conductive patterns 121 and a plurality of conductive vias 122 between the conductive patterns 121.

The ground connection pattern 120a and the signal connection pattern 120b may be surrounded by an insulating structure 123. The insulating structure 123 may include a plurality of insulating layers. The ground connection pattern 120a, the signal connection pattern 120b, and the insulating structure 123 may form a frame 120.

The insulating structure 123 may include an insulating material. For example, the insulating material may include a thermosetting resin (e.g., an epoxy resin), a thermoplastic resin (e.g., polyimide), or an insulating material in which the thermosetting resin or the thermoplastic resin is impregnated into a core material (e.g. inorganic filler and/or glass fiber (or glass cloth or glass fabric)). The insulating material may be, e.g., prepreg, an ABF, flame retardant 4 (FR-4), or bismaleimide triazine (BT). The plurality of conductive patterns 121 and the plurality of conductive vias 122 may include, e.g., a conductive material including copper, gold, silver, nickel, tungsten, aluminum, or a combination thereof. In some embodiments, the plurality of conductive patterns 121 and the plurality of conductive vias 122 may further include a barrier material to prevent the diffusion of the conductive material into the insulating structure 123. The barrier material may include, e.g., titanium, tantalum, titanium nitride, tantalum nitride, or a combination thereof.

The first molding 140 may cover the first semiconductor chip 110 on the first package substrate 130. In some embodiments, the first molding 140 may further cover the frame 120. That is, the first molding 140 may further cover the insulating structure 123, the ground connection pattern 120a, and the signal connection pattern 120b. The first molding 140 may further fill a space between the insulating structure 123 and the first semiconductor chip 110. For example, the first molding 140 may include a thermosetting resin (e.g., an epoxy resin), a thermoplastic resin (e.g., polyimide), or a resin (e.g., an ABF, FR-4, and BT) in which the thermosetting resin or the thermoplastic resin includes a stiffener (e.g., inorganic filler). In addition, the first molding 140 may include a molding material (e.g., an epoxy mold compound (EMC)), or a photosensitive material (e.g., a photo imagable encapsulant (PIE)).

The warpage control layer 160 may be, e.g., directly, on the first molding 140. Warpage of the semiconductor package 100 may be reduced by inserting the warpage control layer 160 into the semiconductor package 100. The warpage control layer 160 may include the same material as the first substrate conductive pattern 131 and the first substrate conductive via 132. For example, The warpage control layer 160 may include a conductive material, e.g., copper, gold, silver, nickel, tungsten, aluminum, or a combination thereof. The warpage control layer 160 may be separated from the ground connection pattern 120a and the signal connection pattern 120b, e.g., by the first molding 140. That is, the warpage control layer 160 may not be in direct contact with the ground connection pattern 120a and may not be in direct contact with the signal connection pattern 120b.

A thickness t of the warpage control layer 160 may be in a range of about 5 μm to about 15 μm, e.g., along a direction normal to the lower surface of the first body 111. When the thickness t of the warpage control layer 160 is less than about 5 μm, the warpage of the semiconductor package 100 may become excessively great. When the thickness t of the warpage control layer 160 is greater than about 15 μm, the semiconductor package 100 may become excessively thick.

The upper insulating layer 170 may be on the warpage control layer 160, e.g., the warpage control layer 160 may be between the upper insulating layer 170 and the first molding 140. In some embodiments, the upper insulating layer 170 may include a composite material. That is, the upper insulating layer 170 may include a matrix and filler in the matrix. The matrix may include, e.g., a polymer, and the filler may include, e.g., silica, titanium oxide, or a combination thereof. In some embodiments, the upper insulating layer 170 may be formed using a build-up film, e.g., an ABF.

The first opening OP1 may pass through the upper insulating layer 170 to expose the warpage control layer 160, e.g., the first opening OP1 may expose a portion of an upper surface of the warpage control layer 160. The second opening OP2 may overlap the first opening OP1 in a view from above, i.e., in a top view, and pass through the warpage control layer 160 and the first molding 140 to expose, e.g., a top of, the ground connection pattern 120a. The third opening OP3 may pass through the upper insulating layer 170 and the first molding 140 to expose, e.g., a top of, the signal connection pattern 120b. The warpage control layer 160 may be separated from the third opening OP3, e.g., by the first molding 140 and the upper insulating layer 170. That is, the warpage control layer 160 may not be exposed by the third opening OP3, the third opening OP3 may pass through a portion not including the warpage control layer 160. In an upper surface of the warpage control layer 160, a diameter D1 of the first opening OP1 may be greater than a diameter of the second opening OP2, e.g., in a top view. Accordingly, the first opening OP1 may expose, e.g., a portion of, the upper surface of the warpage control layer 160.

As can be seen from the plan view of FIG. 1B, in a view from above, a portion of the warpage control layer 160 exposed by the first opening OP1 may have an annular shape surrounding the second opening OP2. In the view from above, a, e.g., constant width, width W of the portion of the warpage control layer 160 exposed by the first opening OP1 may be in a range of about 5 μm to about 15 μm. When the width W of the exposed portion is less than about 5 μm, a contact area between the warpage control layer 160 and a second ground bump (refer to 280a in FIG. 5) may be excessively reduced, and thus, it may be difficult to connect the warpage control layer 160 to the ground connection pattern 120a through the second ground bump 280a. When the width W of the exposed portion is greater than about 15 μm, the diameter D1 of the first opening OP1 may be excessively increased, and thus, the integration density of the semiconductor package 100 may be reduced.

In some embodiments, the semiconductor package 100 may further include a wetting pad 150 on the ground connection pattern 120a and the signal connection pattern 120b. The wetting pad 150 may be inside, e.g., exposed by, the second opening OP2 and inside, e.g., exposed by, the third opening OP3. The wetting pad 150 may include, e.g., gold (Au).

Figure 2:
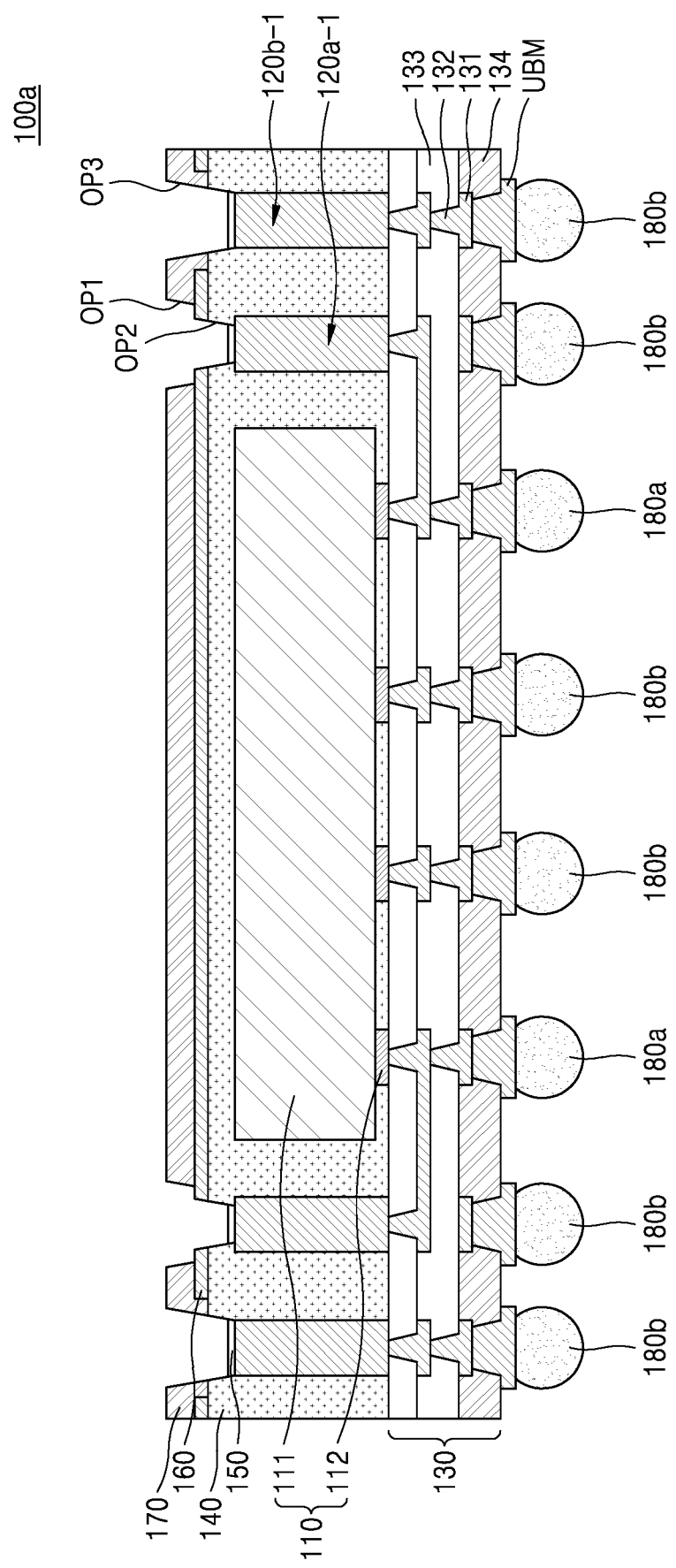
FIG. 2 is a cross-sectional view of a semiconductor package according to an embodiment.

FIG. 2 is a cross-sectional view of a semiconductor package 100a according to an embodiment. Hereinafter, differences between the semiconductor package 100 shown in FIGS. 1A and 1B and the semiconductor package 100a shown in FIG. 2 will be described.

Referring to FIG. 2, the semiconductor package 100a may include a ground connection pattern 120a-1 and a signal connection pattern 120b-1 instead of the ground connection pattern 120a and the signal connection pattern 120b of the semiconductor package 100 in FIG. 1A. Each of the ground connection pattern 120a-1 and the signal connection pattern 120b-1 may be integrally formed. In some embodiments, each of the ground connection pattern 120a-1 and the signal connection pattern 120b-1 may be a conductive pillar. Each of the ground connection pattern 120a-1 and the signal connection pattern 120b-1 may be surrounded by the first molding 140. Each of the ground connection pattern 120a-1 and the signal connection pattern 120b-1 may be in direct contact with the first molding 140. In some embodiments, the semiconductor package 100a may be a wafer-level package (WLP).

Figure 3:
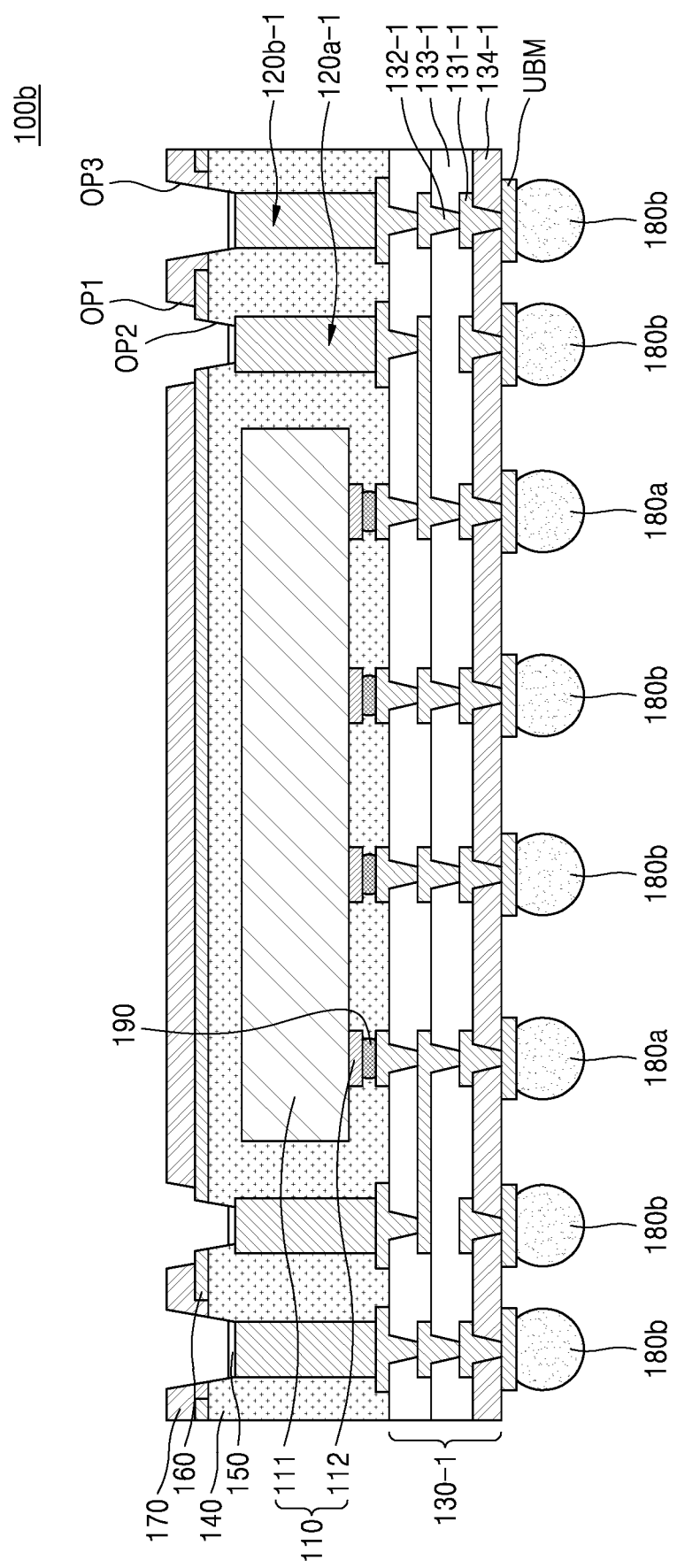
FIG. 3 is a cross-sectional view of a semiconductor package according to an embodiment.

FIG. 3 is a cross-sectional view of a semiconductor package 100b according to an embodiment. Hereinafter, differences between the semiconductor package 100a shown in FIG. 2 and the semiconductor package 100b shown in FIG. 3 will be described.

Referring to FIG. 3, the semiconductor package 100b may include a first package substrate 130-1 instead of the first package substrate 130 shown in FIG. 2. The first package substrate 130-1 may include a first substrate insulating layer 133-1, a first substrate conductive pattern 131-1 on an upper surface of the first substrate insulating layer 133-1, a first substrate conductive via 132-1 configured to pass through the first substrate insulating layer 133-1 and come into contact with the first substrate conductive pattern 131-1, and a first substrate protective layer 134-1 on a lower surface of the first substrate insulating layer 133-1. A diameter of an upper end of the first substrate conductive via 132-1 may be greater than a diameter of a lower end thereof. In some embodiments, the first package substrate 130-1 may have a redistribution structure.

The semiconductor package 100b may further include a first chip bump 190 between the first chip pad 112 of the first semiconductor chip 110 and the first substrate conductive pattern 131-1 of the first package substrate 130-1. The first chip bump 190 may connect the first chip pad 112 of the first semiconductor chip 110 to the first substrate conductive pattern 131-1 of the first package substrate 130-1. The first chip bump 190 may include a conductive material, e.g., tin, lead, silver, copper, or a combination thereof.

Figure 4:
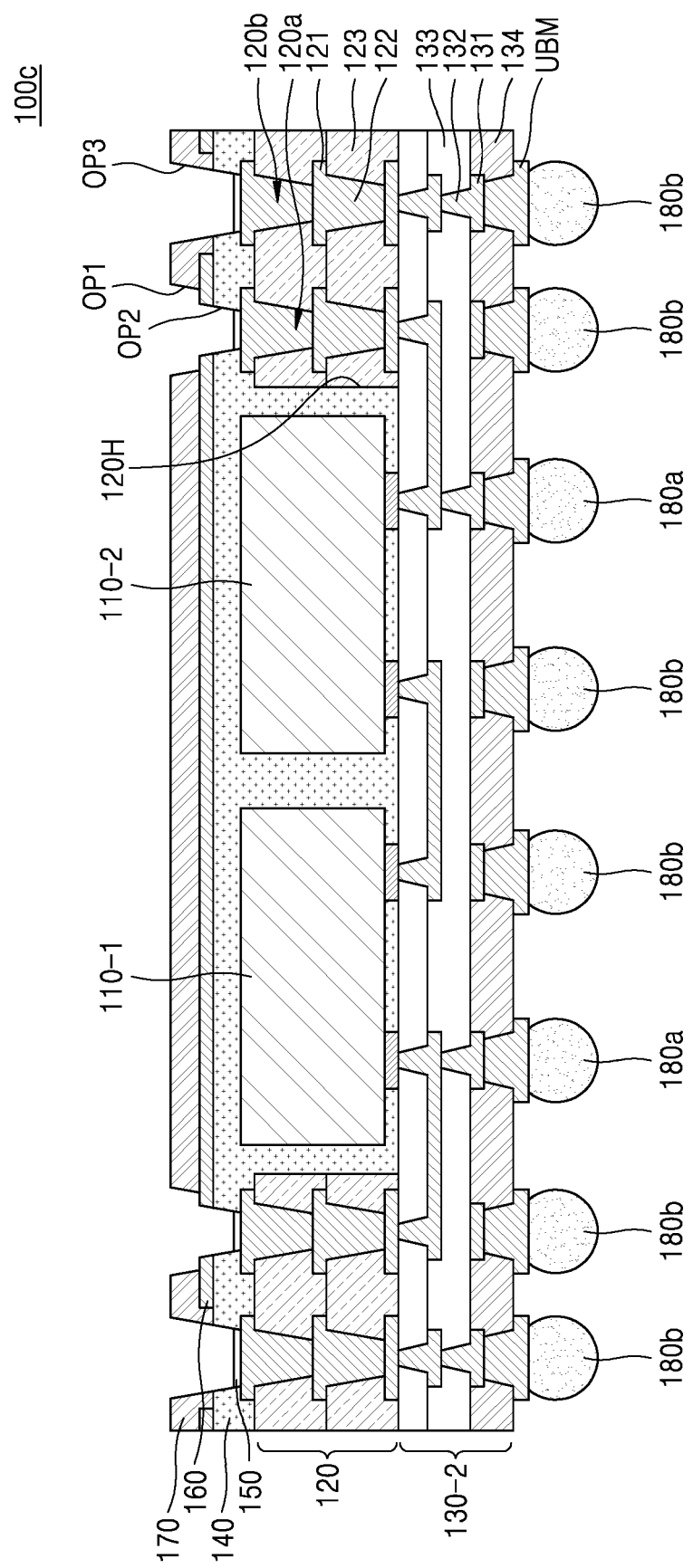
FIG. 4 is a cross-sectional view of a semiconductor package according to an embodiment.

FIG. 4 is a cross-sectional view of a semiconductor package 100c according to an embodiment. Hereinafter, differences between the semiconductor package 100 shown in FIG. 1A and the semiconductor package 100c shown in FIG. 4 will be described.

Referring to FIG. 4, the semiconductor package 100c may include a plurality of first semiconductor chips (e.g., 110-1 and 110-2). The first semiconductor chips 110-1 and 110-2 may be on a first package substrate 130-2. In some embodiments, the first semiconductor chips 110-1 and 110-2 may include different ICs. For example, one first semiconductor chip 110-1 may include a memory chip, while another first semiconductor chip 110-2 may include a logic chip. In other embodiments, the first semiconductor chips 110-1 and 110-2 may include the same IC. The first semiconductor chips 110-1 and 110-2 may be connected to each other through the first package substrate 130-2. That is, the first package substrate 130-2 may further include an electrical path configured to connect the first semiconductor chips 110-1 and 110-2 to each other.

Figure 5:
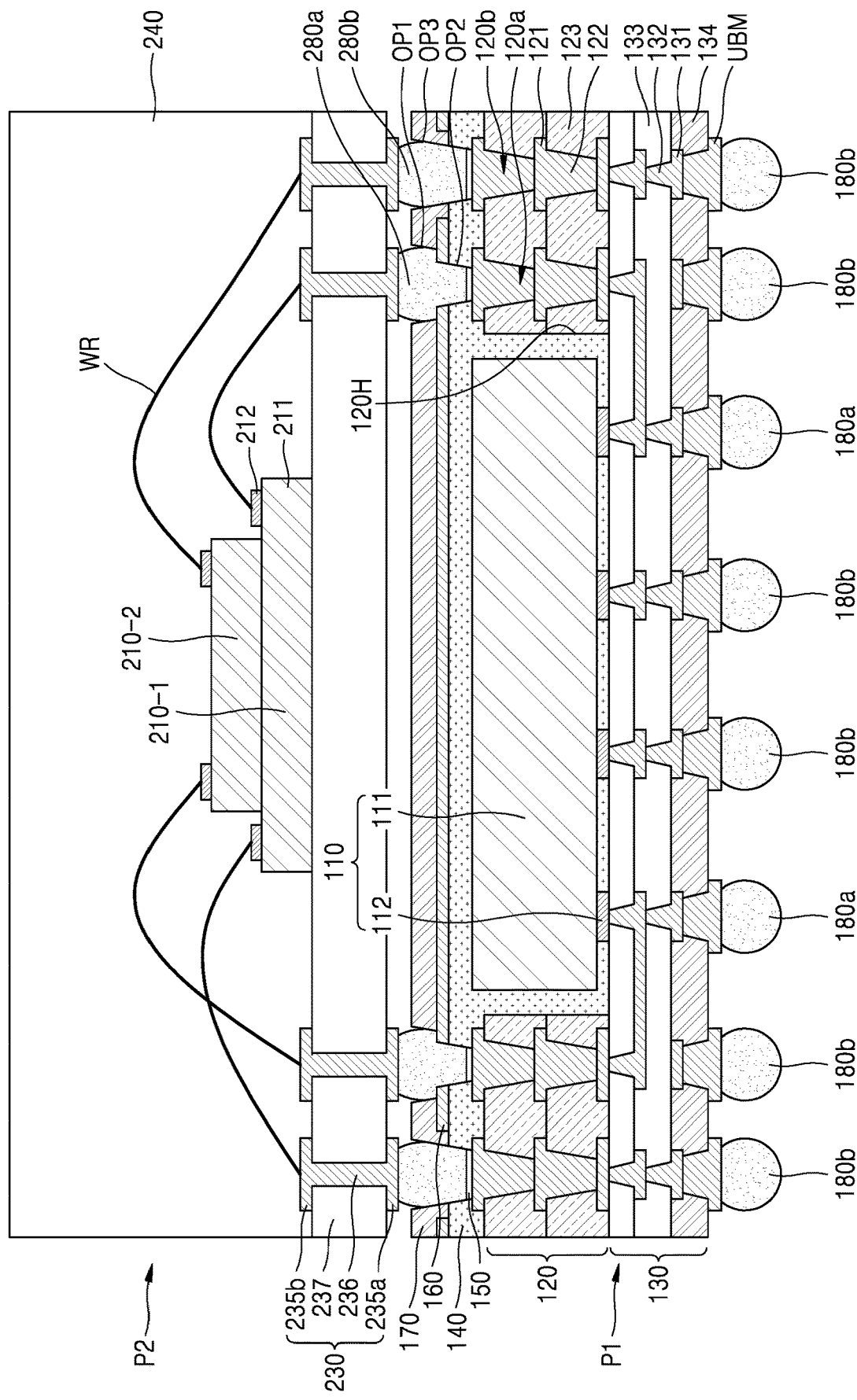
FIG. 5 is a cross-sectional view of a semiconductor package according to an embodiment.

FIG. 5 is a cross-sectional view of a semiconductor package 200 according to an embodiment.

Referring to FIG. 5, the semiconductor package 200 may include a first sub-package P1 and a second sub-package P2 on the first sub-package P1. That is, the semiconductor package 200 may be a package-on-package (POP) type. The first sub-package P1 may be one of the semiconductor package 100 of FIG. 1A, the semiconductor package 100a of FIG. 2, the semiconductor package 100b of FIG. 3, and the semiconductor package 100c of FIG. 4.

The second sub-package P2 may include a second package substrate 230, a second semiconductor chip 210-1, a second molding 240, a second ground bump 280a, and a second signal bump 280b. The second package substrate 230 may include, e.g., a second substrate insulating layer 237, an upper conductive pattern layer 235b on an upper surface of the second substrate insulating layer 237, a lower conductive pattern layer 235a on a lower surface of the second substrate insulating layer 237, and a substrate conductive via 236 configured to pass through the second substrate insulating layer 237, extend between the upper conductive pattern layer 235b and the lower conductive pattern layer 235a, and connect the upper conductive pattern layer 235b to the lower conductive pattern layer 235a. In some embodiments, the second package substrate 230 may be a PCB.

The second substrate insulating layer 237 may include, e.g., FR-4, tetrafunctional epoxy, polyphenylene ether, epoxy/polyphenylene oxide, BT, Thermount, cyanate ester, polyimide, or a combination thereof. The upper conductive pattern layer 235b, the lower conductive pattern layer 235a, and the substrate conductive via 236 may include, e.g., a conductive material including copper, gold, silver, nickel, tungsten, aluminum, or a combination thereof.

The second semiconductor chip 210-1 may be on the second package substrate 230. The second semiconductor chip 210-1 may include a second body 211 and a second chip pad 212 on an upper surface of the second body 211. The second body 211 may include a substrate and an IC, and the IC may be on an upper surface of the second semiconductor chip 210-1. That is, an active surface of the second semiconductor chip 210-1 may be the upper surface of the second semiconductor chip 210-1.

The IC of the second body 211 of the second semiconductor chip 210-1 may be the same as or different from an IC of a first body 111 of the first semiconductor chip 110. In some embodiments, the IC of the first body 111 of the first semiconductor chip 110 of the first sub-package P1 may include a logic circuit, while the IC of the second body 211 of the second semiconductor chip 210-1 of the second sub-package P2 may include a memory circuit. More specifically, the IC of the first body 111 of the first semiconductor chip 110 of the first sub-package P1 may include an application processor (AP) circuit, while the IC of the second body 211 of the second semiconductor chip 210-1 of the second sub-package P2 may include a DRAM circuit.

The second semiconductor chip 210-1 may be connected to the upper conductive pattern layer 235b of the second package substrate 230 through a wire. In other embodiments, the second chip pad 212 of the second semiconductor chip 210-1 may be on a lower surface of the second semiconductor chip 210-1, and the IC of the second body 211 of the second semiconductor chip 210-1 may be on the lower surface of the second semiconductor chip 210-1. That is, an active surface of the second semiconductor chip 210-1 may be the lower surface of the second semiconductor chip 210-1. The second semiconductor chip 210-1 may be connected to the upper conductive pattern layer 235b of the second package substrate 230 through a bump or a pillar.

In some embodiments, the second sub-package P2 may include a plurality of semiconductor chips (e.g., the first and second semiconductor chips 210-1 and 210-2). The first and second semiconductor chips 210-1 and 210-2 may be stacked on the second package substrate 230.

The second molding 240 may be on the second package substrate 230 and cover the second package substrate 230 and the first and second semiconductor chips 210-1 and 210-2. The second molding 240 may include a thermosetting resin (e.g., an epoxy resin), a thermoplastic resin (e.g., polyimide), or a resin (specifically, an ABF, FR-4, and BT) in which the thermosetting resin or the thermoplastic resin includes a stiffener (e.g., inorganic filler). In addition, the second molding 240 may include a molding material (e.g., an EMC) or a photosensitive material (e.g., a PIE).

The second ground bump 280a may be on the lower conductive pattern layer 235a of the second package substrate 230. The second ground bump 280a may be in contact with the warpage control layer 160 and the ground connection pattern 120a through the first opening OP1 and the second opening OP2 of the first sub-package P1. The second ground bump 280a may be in contact with an upper surface of the warpage control layer 160. In some embodiments, the second ground bump 280a may be further in contact with a side surface of the warpage control layer 160, which is exposed through the second opening OP2. The warpage control layer 160 may be electrically connected to the ground connection pattern 120a through the second ground bump 280a. In other words, the warpage control layer 160 may be grounded through the second ground bump 280a. That is, the warpage control layer 160 may be a dummy layer that does not transmit signals other than ground signal. When the warpage control layer 160 is grounded, signal characteristics and power characteristics of the semiconductor package 200 may be improved. Also, because vias for grounding the warpage control layer 160 are not formed, a process of manufacturing the semiconductor package 200 may be simplified. The second ground bump 280a may include, e.g., a conductive material including tin, lead, silver, copper, or a combination thereof. The second ground bump 280a may be formed using, e.g., a solder ball.

The second signal bump 280b may be on the lower conductive pattern layer 235a of the second package substrate 230. The second signal bump 280b may be in contact with the signal connection pattern 120b through the third opening OP3 of the first sub-package P1. The second signal bump 280b may transmit signals to the signal connection pattern 120b or receive signals from the signal connection pattern 120b. Because the warpage control layer 160 is not exposed by the third opening OP3, the second signal bump 280b may be separated from the warpage control layer 160. The second signal bump 280b may include, e.g., a conductive material including tin, lead, silver, copper, or a combination thereof. The second signal bump 280b may be formed using, e.g., a solder ball.

Figure 6:
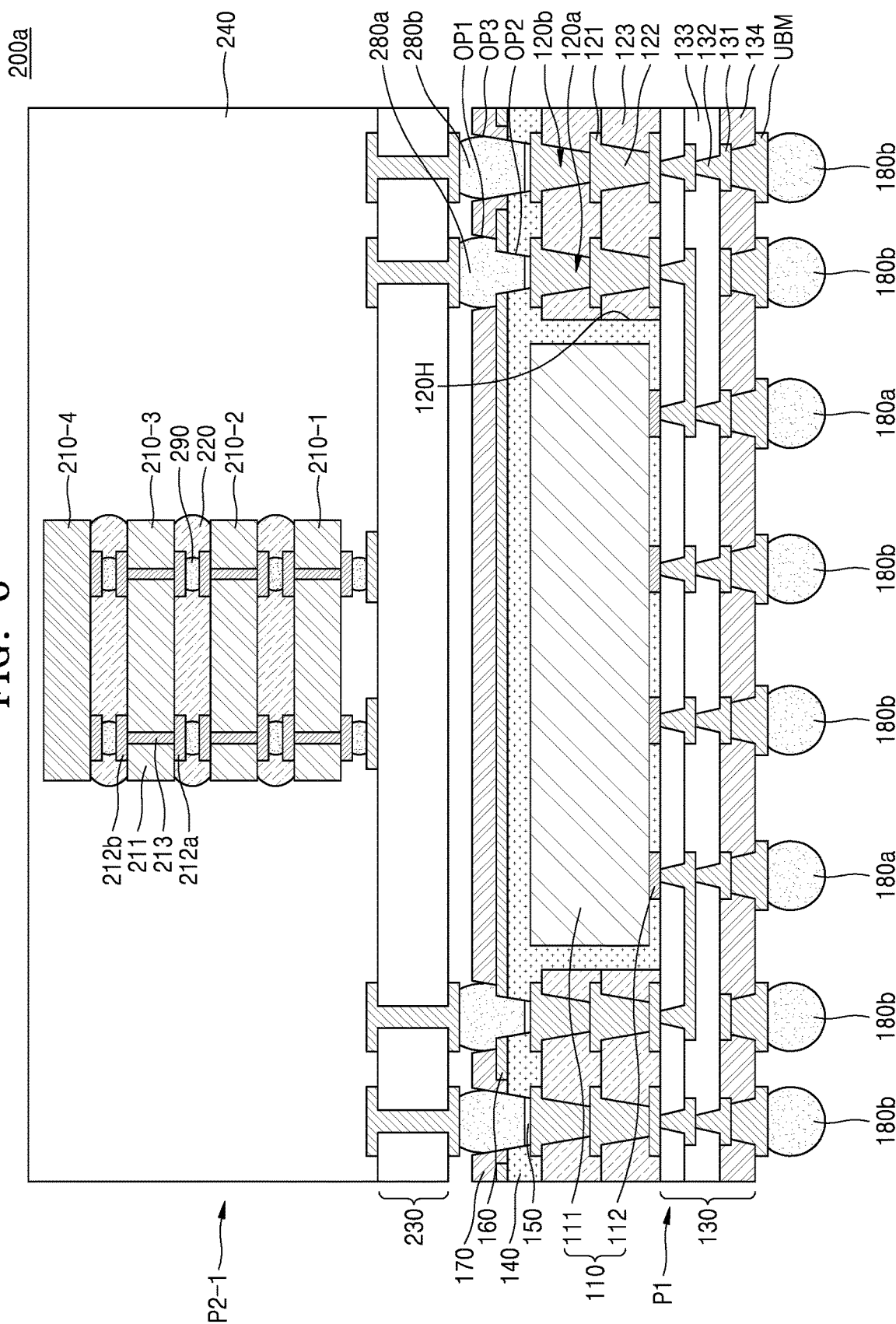
FIG. 6 is a cross-sectional view of a semiconductor package according to an embodiment.

FIG. 6 is a cross-sectional view of a semiconductor package 200a according to an embodiment. Hereinafter, differences between the semiconductor package 200 shown in FIG. 5 and the semiconductor package 200a shown in FIG. 6 will be described.

Referring to FIG. 6, the semiconductor package 200a may include the first sub-package P1 and a second sub-package P2-1 on the first sub-package P1. The second sub-package P2-1 may include the second package substrate 230, a plurality of second semiconductor chips (e.g., 210-1, 210-2, 210-3, and 210-4), a second chip bump 290, a chip adhesive layer 220, the second molding 240, the second ground bump 280a, and the second signal bump 280b.

The second semiconductor chips 210-1, 210-2, 210-3, and 210-4 may be stacked on the second package substrate 230. The number of second semiconductor chips stacked on the second package substrate 230 is not limited to four, and fewer or more second semiconductor chips may be stacked on the second package substrate 230.

Each of the second semiconductor chips 210-1, 210-2, 210-3, and 210-4 may include the second body 211, a lower chip pad 212a on a lower surface of the second body 211, an upper chip pad 212b on an upper surface of the second body 211, and a through-substrate via 213 configured to pass through the second body 211. The second semiconductor chip 210-4 located at an uppermost level may not include the upper chip pad 212b and the through-substrate via 213. The through-substrate via 213 may connect the upper chip pad 212b to the lower chip pad 212a. The through-substrate via 213, the upper chip pad 212b, and the lower chip pad 212a may include a conductive material, e.g., copper (Cu), aluminum (Al), silver (Ag), tungsten (W), or a combination thereof.

The second chip bump 290 may be between two adjacent ones of the second semiconductor chips 210-1, 210-2, 210-3, and 210-4. The second semiconductor chips 210-1, 210-2, 210-3, and 210-4 may be electrically connected to each other through the second chip bump 290. The second chip bump 290 may be a microbump having a width of several micrometers (μm) to several hundred μm. The second chip bump 290 may include, e.g., tin (Sn), indium (In), bismuth (Bi), antimony (Sb), copper (Cu), silver (Ag), gold (Au), zinc (Zn), lead (Pb), or a combination thereof.

In some embodiments, a chip pillar may be further positioned between the second chip bump 290 and the lower chip pad 212a. The chip pillar may include, e.g., at least one of nickel, copper, palladium, platinum, and gold. In some embodiments, a middle layer may be further formed between the chip pillar and the second chip bump 290 and/or between the second chip bump 290 and the upper chip pad 212b. The middle layer may include an inter-metal compound formed by reaction of a metal material included in the second chip bump 290 with a metal material included in the chip pillar or reaction of a metal material included in the second chip bump 290 with a metal material included in the upper chip pad 212b.

The chip adhesive layer 220 may be between two adjacent ones of the second semiconductor chips 210-1, 210-2, 210-3, and 210-4. The chip adhesive layer 220 may surround the second chip bump 290 and fill spaces between the second semiconductor chips 210-1, 210-2, 210-3, and 210-4. The chip adhesive layer 220 may adhere the second semiconductor chips 210-1, 210-2, 210-3, and 210-4 to each other and protect the second chip bump 290. The chip adhesive layer 220 may be formed using a film-type adhesive or a paste-type adhesive.

In some embodiments, the chip adhesive layer 220 may include a non-conductive adhesive including a polymer resin. In other embodiments, the chip adhesive layer 220 may include an anisotropic conductive adhesive or an isotropic conductive adhesive including conductive particles and a polymer resin. The polymer resin of the chip adhesive layer 220 may include, e.g., a thermosetting resin, a thermoplastic resin, or an ultraviolet (UV) curable resin. The chip adhesive layer 220 may include, e.g., at least one of an epoxy resin, a urethane resin, and an acryl resin. The conductive particles of the chip adhesive layer 220 may include, e.g., at least one of nickel (Ni), gold (Au), silver (Ag), and copper (Cu).

In some embodiments, the second sub-package P2-1 may further include an interposer between the second package substrate 230 and the second semiconductor chip 210-1 located at a lowermost level.

Figure 7:
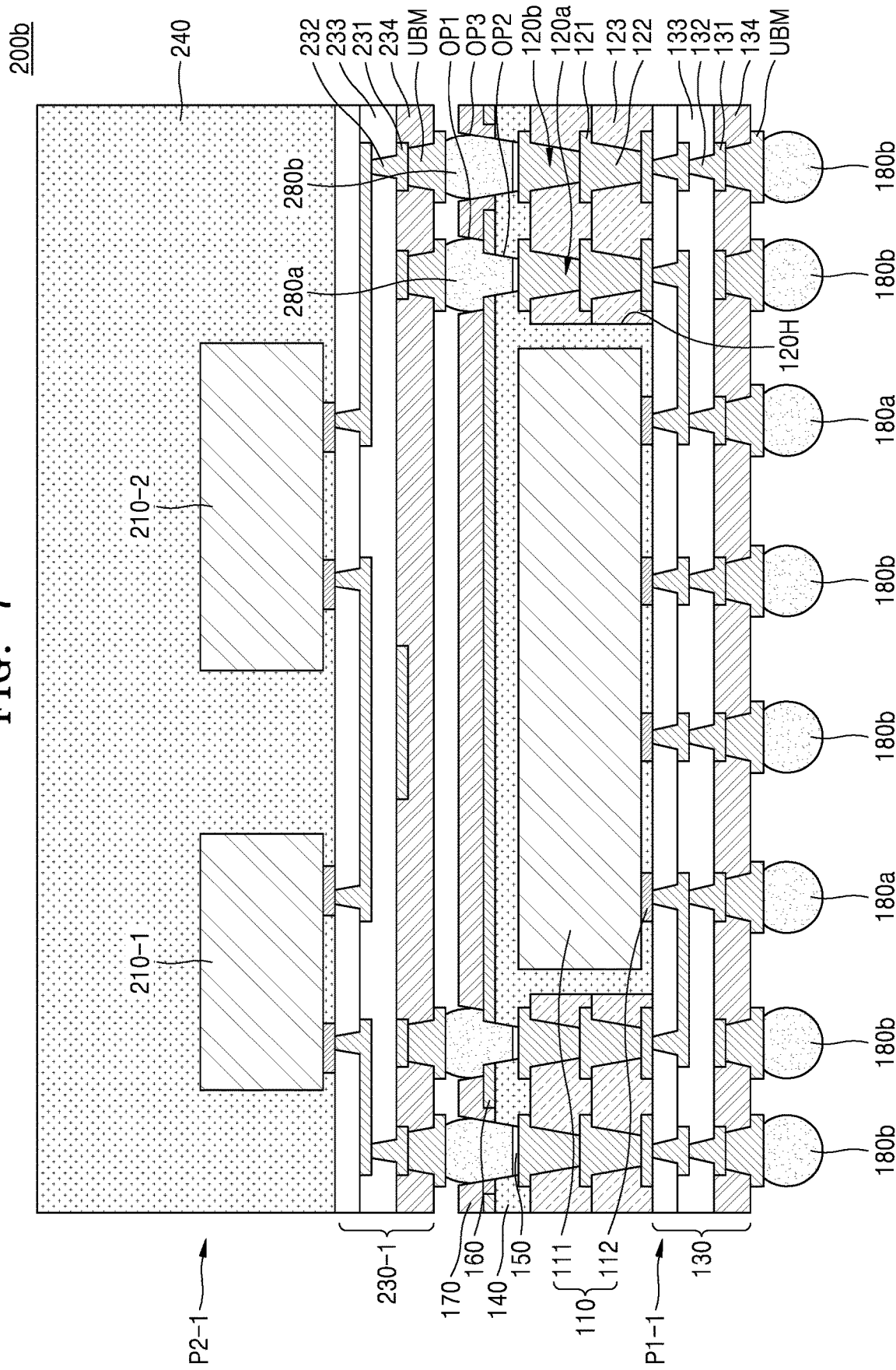
FIG. 7 is a cross-sectional view of a semiconductor package according to an embodiment.

FIG. 7 is a cross-sectional view of a semiconductor package 200b according to an embodiment. Hereinafter, differences between the semiconductor package 200 shown in FIG. 5 and the semiconductor package 200b shown in FIG. 7 will be described.

Referring to FIG. 7, the semiconductor package 200b may include the first sub-package P1-1 and a second sub-package P2-1 on the first sub-package P1-1. The second sub-package P2-1 may include a second package substrate 230-1, a plurality of second semiconductor chips (e.g., 210-1 and 210-2), the second molding 240, the second ground bump 280a, and the second signal bump 280b.

The second package substrate 230-1 may include a second substrate insulating layer 233, a second substrate conductive pattern 231 on a lower surface of the second substrate insulating layer 233, a second substrate conductive via 232 configured to pass through the second substrate insulating layer 233 and come into contact with the second substrate conductive pattern 231, and a second substrate protective layer 234 covering the second substrate conductive pattern 231 and the second substrate insulating layer 233.

The second substrate conductive pattern 231 and the second substrate conductive via 232 may form electrical paths. For example, the second substrate conductive pattern 231 and the second substrate conductive via 232 may form electrical paths configured to connect the second semiconductor chips 210-1 and 210-2 to the second ground bump 280a, electrical paths configured to connect the second semiconductor chips 210-1 and 210-2 to the second signal bump 280b, and an electrical path configured to connect the second semiconductor chips 210-1 and 210-2 to each other.

The second substrate insulating layer 233 may include, e.g., an inorganic insulating material, an organic insulating material, or a combination thereof. The inorganic insulating material may include, e.g., silicon oxide, silicon nitride, or a combination thereof. The organic insulating material may include, e.g., polyimide, an epoxy resin, or a combination thereof. The second substrate conductive pattern 231 and the second substrate conductive via 232 may include, e.g., a conductive material including copper, gold, silver, nickel, tungsten, aluminum, or a combination thereof. In some embodiments, the second substrate conductive pattern 231 and the second substrate conductive via 232 may further include a barrier material to prevent the diffusion of the conductive material into the second substrate insulating layer 233. The barrier material may include, e.g., titanium, tantalum, titanium nitride, tantalum nitride, or a combination thereof.

The second substrate protective layer 234 may physically and/or chemically protect the second package substrate 230-1 from the environment. In some embodiments, the second substrate protective layer 234 may include a composite material. That is, the second substrate protective layer 234 may include a matrix and filler in the matrix. The matrix may include, e.g., a polymer, and the filler may include, e.g., silica, titanium oxide, or a combination thereof. In some embodiments, the second substrate protective layer 234 may be formed using a build-up film, e.g., an ABF.

The second package substrate 230-1 may further include an under-bump metal UBM, which is on the second substrate protective layer 234 and in contact with the second substrate conductive pattern 231. The second ground bump 280a and the second signal bump 280b may be on the under-bump metal UBM. In some embodiments, the under-bump metal UBM may include, e.g., an adhesive layer, a barrier layer, a wetting layer, and an anti-oxidation layer. The adhesive layer may include, e.g., chromium, titanium, nickel, tungsten, or a combination thereof. The barrier layer may include, e.g., chromium, tungsten, titanium, and/or nickel. The wetting layer may include, e.g., copper, nickel, platinum, palladium, or a combination thereof. The anti-oxidation layer may include gold (Au).

The second semiconductor chips 210-1 and 120-2 may be arranged in parallel on the second package substrate 230-1. The second semiconductor chips 210-1 and 120-2 may be connected to each other through the second package substrate 230-1.

FIGS. 8A to 8F are cross-sectional views of stages in a method of manufacturing the semiconductor package 100 (in FIG. 1A), according to an embodiment.

Figure 8A:
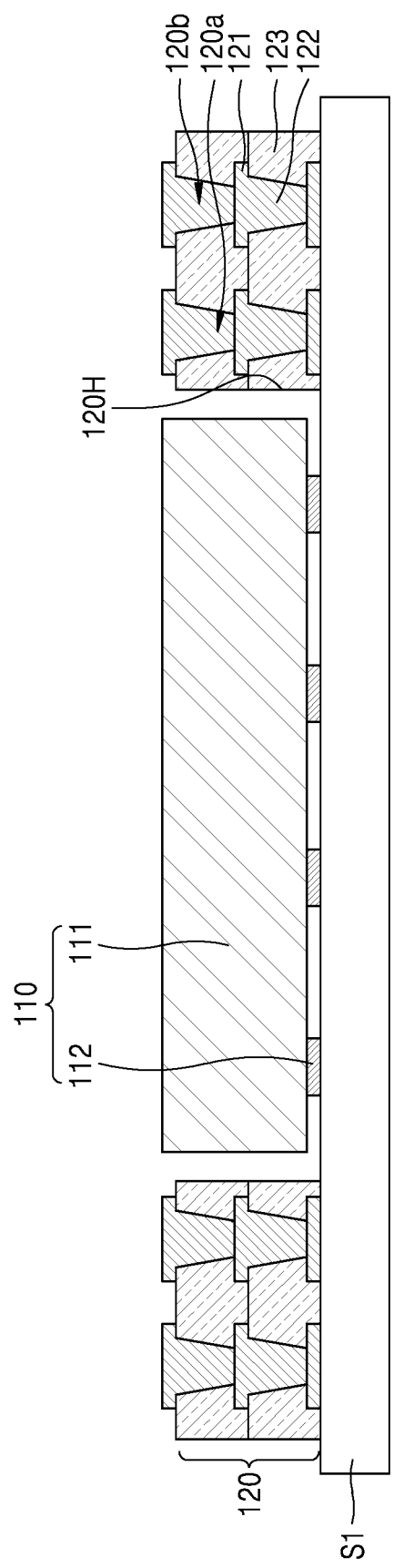
FIGS. 8A to 8F are cross-sectional views of stages in a method of manufacturing a semiconductor package, according to an embodiment.

Referring to FIG. 8A, a hole 120H may be formed in the frame 120 to pass through the frame 120. The hole 120H of the frame 120 may be formed using, e.g., a mechanical drilling process, a laser drilling process, a sand blast process, a dry etching process, and/or a wet etching process. Next, a first support structure S1 may be adhered to a lower surface of the frame 120. The first support structure S1 may include any suitable material (e.g., an adhesive film) capable of fixing the first support structure S1. The adhesive film may be, e.g., a thermosetting adhesive film of which adhesion is weakened by using a heat treatment process or a UV curable adhesive film of which adhesion is weakened by a UV irradiation process. Thereafter, the first semiconductor chip 110 may be disposed inside the hole 120H of the frame 120, such that the first chip pad 112 of the first semiconductor chip 110 faces the support structure S1, and thus, the first semiconductor chip 110 may be adhered to the first support structure S1, e.g., via the first chip pad 112. For example, the frame 120 may surround, e.g., an entire perimeter of, the first semiconductor chip 110.

Figure 8B:
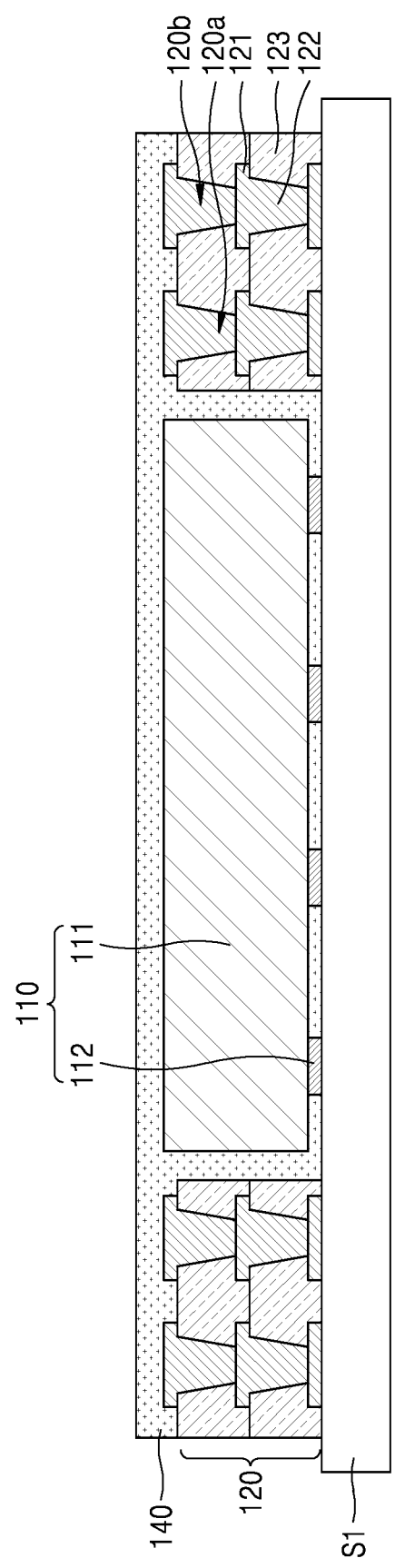

Referring to FIG. 8B, the first molding 140 may be formed to cover the first semiconductor chip 110 and the frame 120, e.g., and in a space between the first semiconductor chip 110 and the frame 120. The first molding 140 may be formed using any suitable method. For example, a sealing material may be laminated on an upper surface of the first semiconductor chip 110 and an upper surface of the frame 120, followed by curing to form the first molding 140. In another example, the first support structure S1, the first semiconductor chip 110, and the frame 120 may be coated with a liquid sealing material, and the liquid sealing material may be cured to form the first molding 140.

Figure 8C:
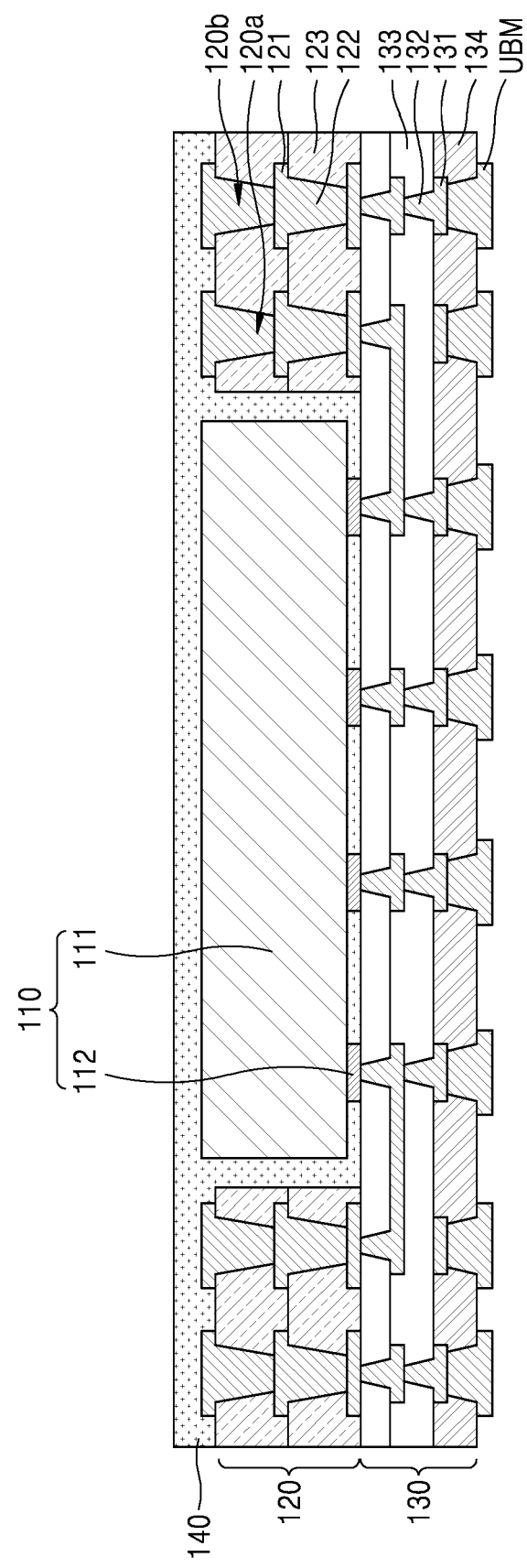

Referring to FIGS. 8B and 8C, the first support structure S1 may be removed from the first semiconductor chip 110 and the frame 120. Next, the first package substrate 130 may be formed on the lower surface of the frame 120 and a lower surface of the first semiconductor chip 110. For example, the first substrate insulating layer 133 may be formed on the lower surface of the frame 120 and the lower surface of the first semiconductor chip 110, and the first substrate conductive via 132 and the first substrate conductive pattern 131 may be formed on the first substrate insulating layer 133. The first substrate protective layer 134 may be formed on the first substrate insulating layer 133, and the under-bump metal UBM may be formed on the first substrate conductive pattern 131.

Unlike as described with reference to FIGS. 8A to 8C, in other embodiments, forming the first package substrate 130 on a support structure (not shown) may be followed by adhering the frame 120 and the first semiconductor chip 110 to the first package substrate 130. Next, the first molding 140 may be formed.

Figure 8D:
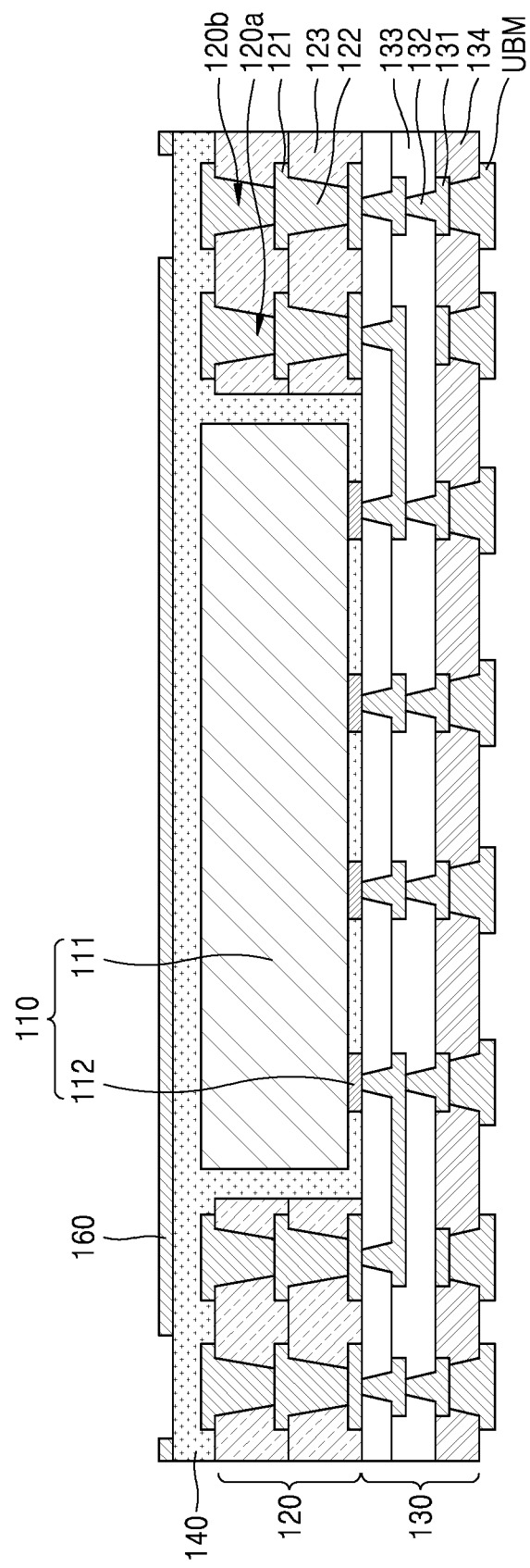

Referring to FIG. 8D, the warpage control layer 160 may be formed on the first molding 140. The warpage control layer 160 may be formed using, e.g., an electroplating process or a sputtering process. For example, as illustrated in FIG. 8D, portions of the warpage control layer 160 overlapping the signal connection patterns 120b may be removed to expose the first molding 140 over the signal connection pattern 120b.

Figure 8E:
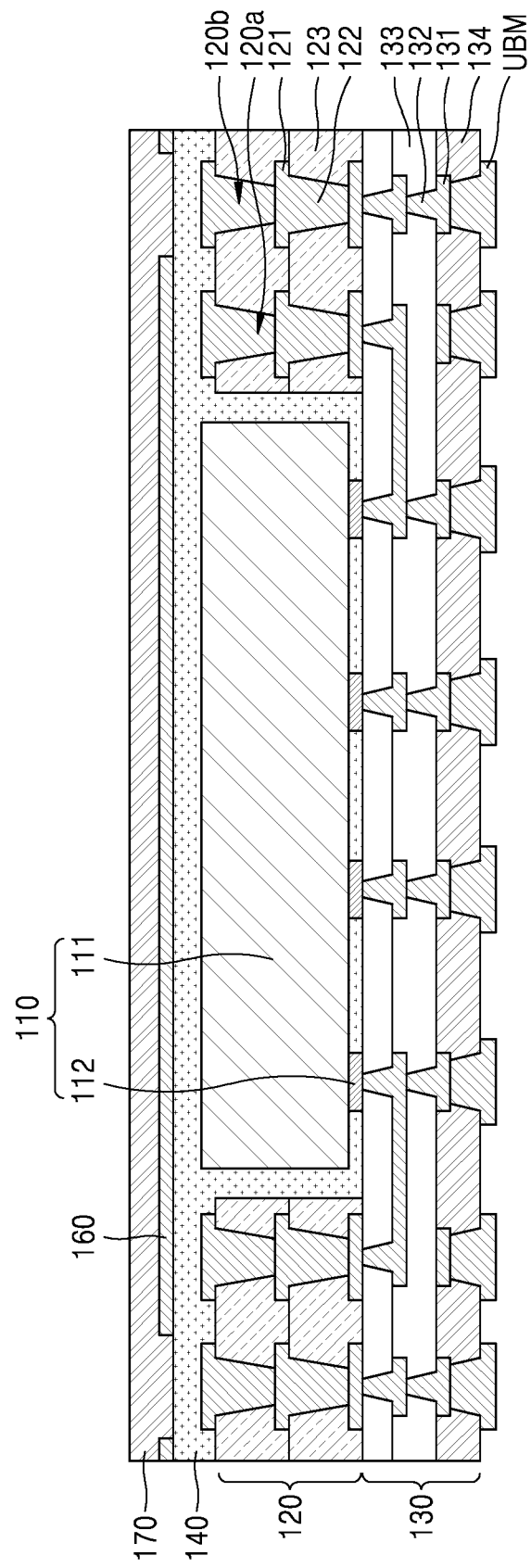

Referring to FIG. 8E, the upper insulating layer 170 may be formed on the warpage control layer 160, e.g., the upper insulating layer 170 may contact portion of the first molding 140 over the signal connection pattern 120b through the warpage control layer 160. For example, a build-up film may be adhered to the warpage control layer 160, thereby forming the upper insulating layer 170.

Figure 8F:
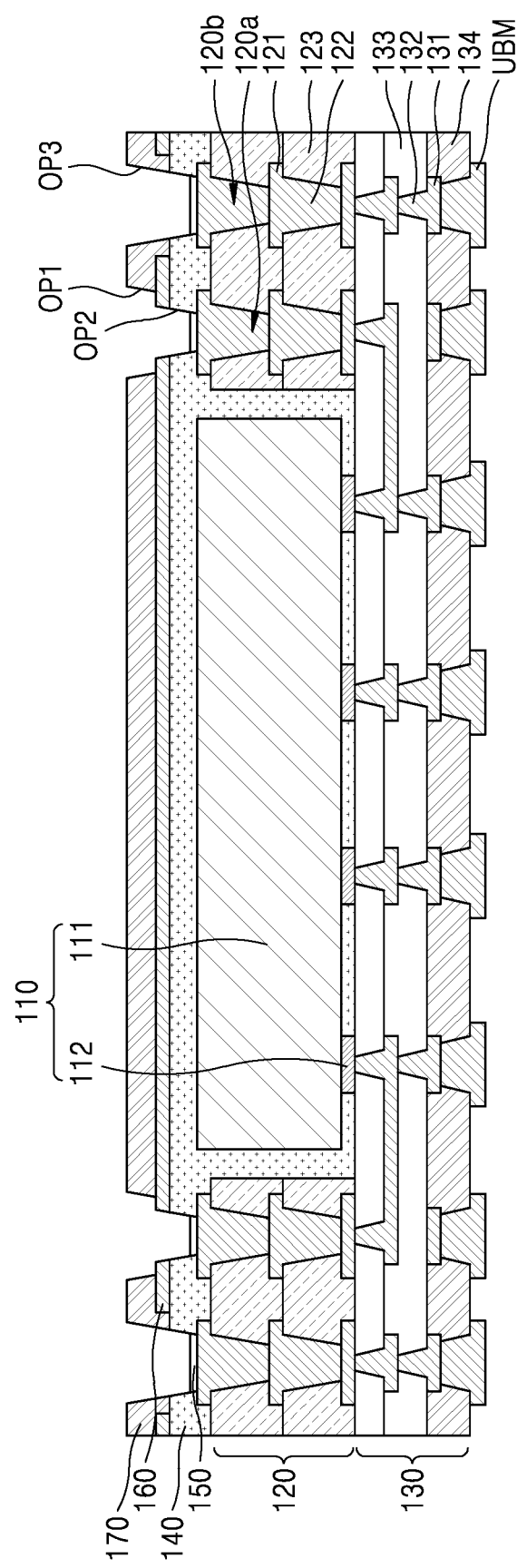

Referring to FIG. 8F, the first opening OP1, the second opening OP2, and the third opening OP3 may be formed. For example, the first opening OP1, the second opening OP2, and the third opening OP3 may be formed using laser. The first opening OP1 may be formed to pass through the upper insulating layer 170 and expose the warpage control layer 160. The second opening OP2 may be formed to pass through the warpage control layer 160 and the first molding 140 and expose the ground connection pattern 120a. The third opening OP3 may be formed to pass through the upper insulating layer 170 and the first molding 140 and expose the signal connection pattern 120b. In some embodiments, the first opening OP1, the second opening OP2, and the third opening OP3 may be formed sequentially.

Next, the wetting pad 150 may be formed on the ground connection pattern 120a inside the second opening OP2. Also, the wetting pad 150 may be formed on the signal connection pattern 120b inside the third opening OP3.

Referring to FIG. 1A, the first ground bump 180a and the first signal bump 180b may be formed on the under-bump metal UBM of the first package substrate 130. For example, by reflowing solder balls, the first ground bump 180a and the first signal bump 180b, which are adhered on the under-bump metal UBM of the first package substrate 130, may be formed. As a result, the manufacture of the semiconductor package 100 shown in FIG. 1A may be completed.

FIGS. 9A to 9G are cross-sectional views of stages in a method of manufacturing the semiconductor package 100a (in FIG. 2), according to an embodiment.

Figure 9A:
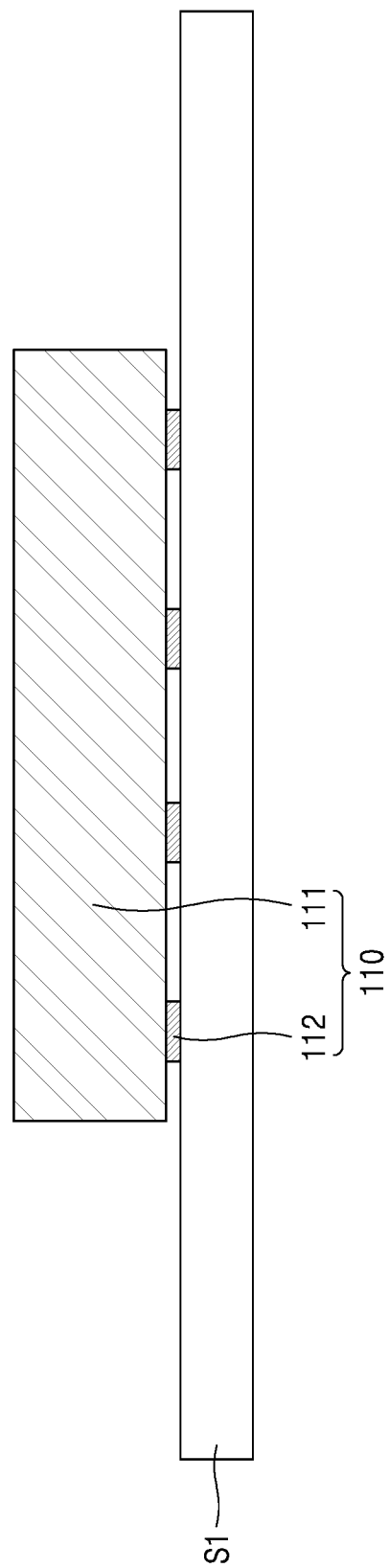
FIGS. 9A to 9G are cross-sectional views of stages in a method of manufacturing a semiconductor package, according to an embodiment.

Referring to FIG. 9A, the first semiconductor chip 110 may be adhered to the first support structure S1 such that the first chip pad 112 faces the first support structure S1.

Figure 9B:
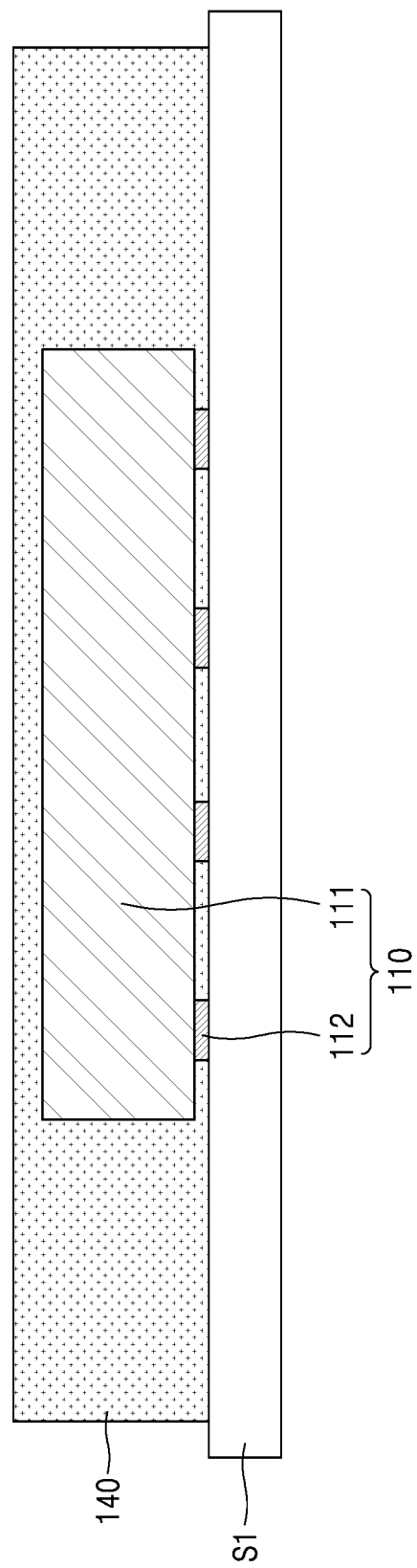

Referring to FIG. 9B, the first molding 140 may be formed on the first support structure S1 to cover the first semiconductor chip 110.

Figure 9C:
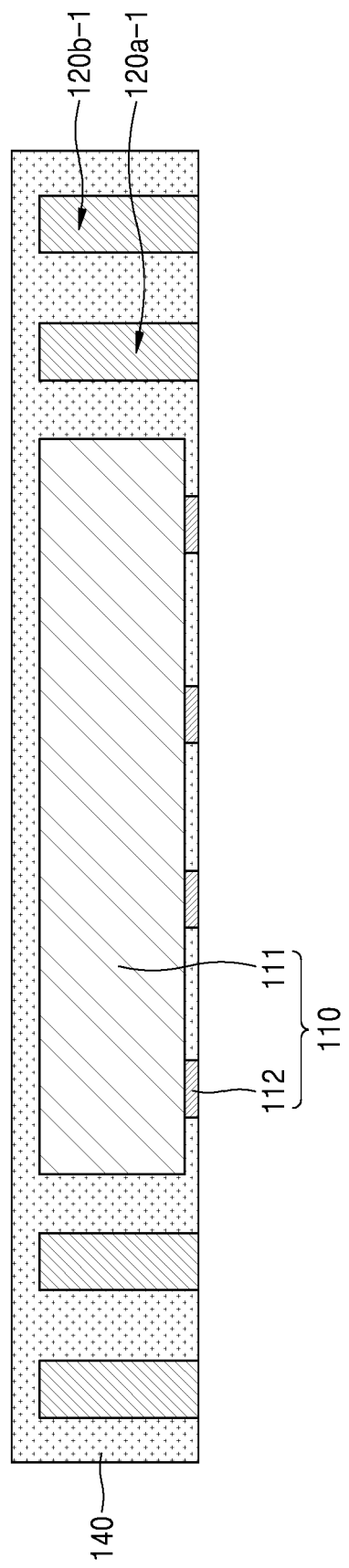

Referring to FIGS. 9B and 9C, the first support structure S1 may be removed from the first molding 140 and the first semiconductor chip 110. The ground connection pattern 120a-1 and the signal connection pattern 120b-1 may be formed in the first molding 140. For example, holes may be formed in the first molding 140 and filled with a conductive material, thereby forming the ground connection pattern 120a-1 and the signal connection pattern 120b-1.

Figure 9D:
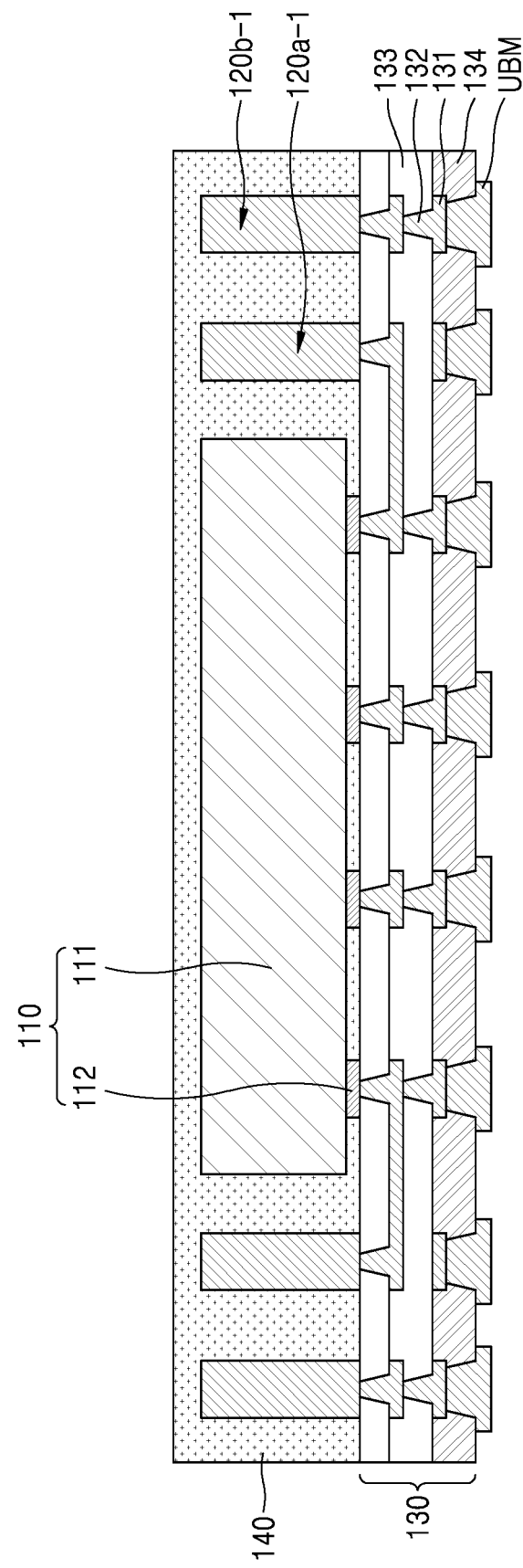

Referring to FIG. 9D, the first package substrate 130 may be formed on a lower surface of the frame 120 and a lower surface of the first semiconductor chip 110.

Figure 9E:
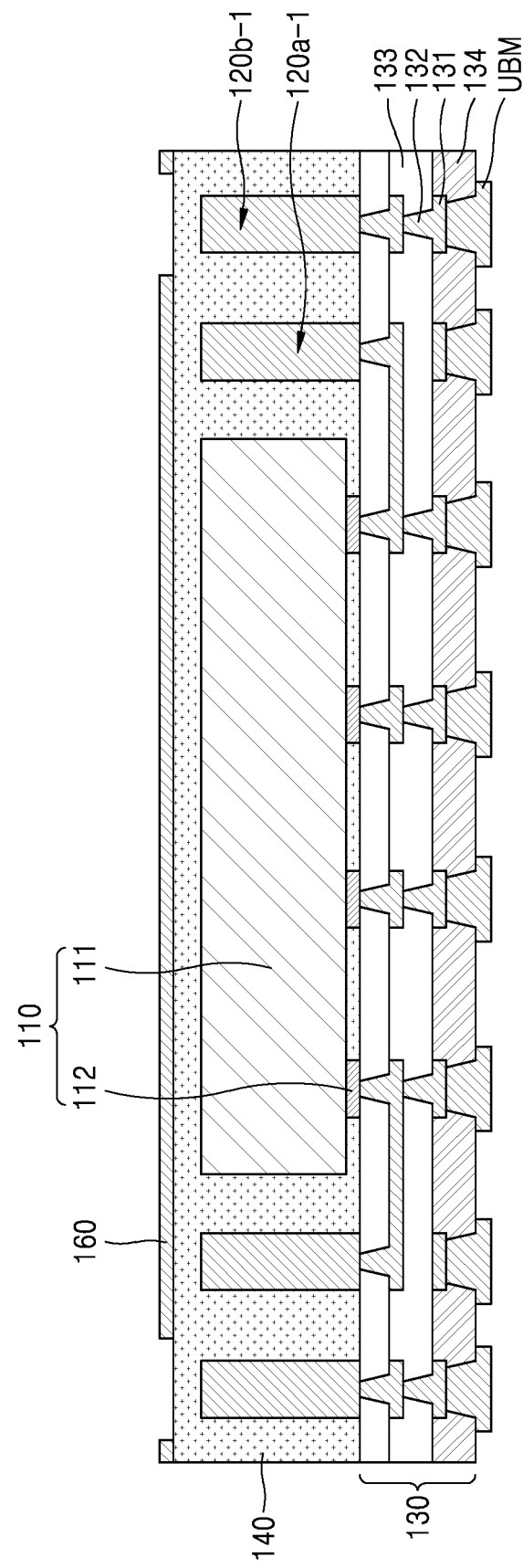

Referring to FIG. 9E, the warpage control layer 160 may be formed on the first molding 140.

Figure 9F:
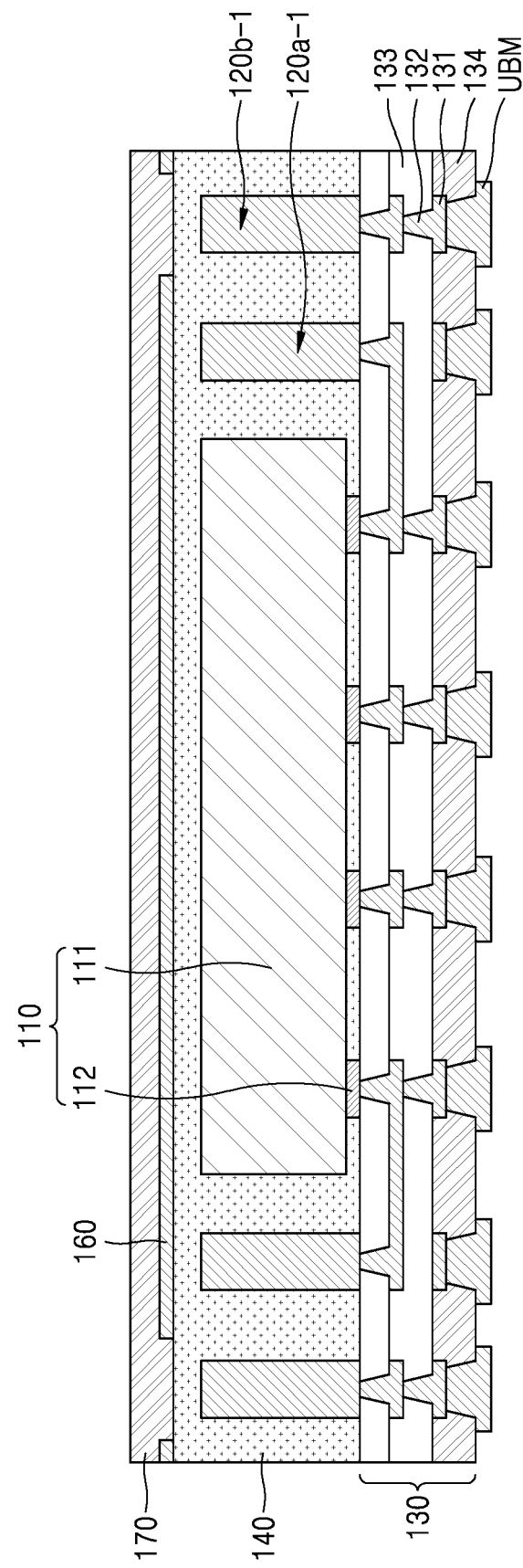

Referring to FIG. 9F, the upper insulating layer 170 may be formed on the warpage control layer 160.

Figure 9G:
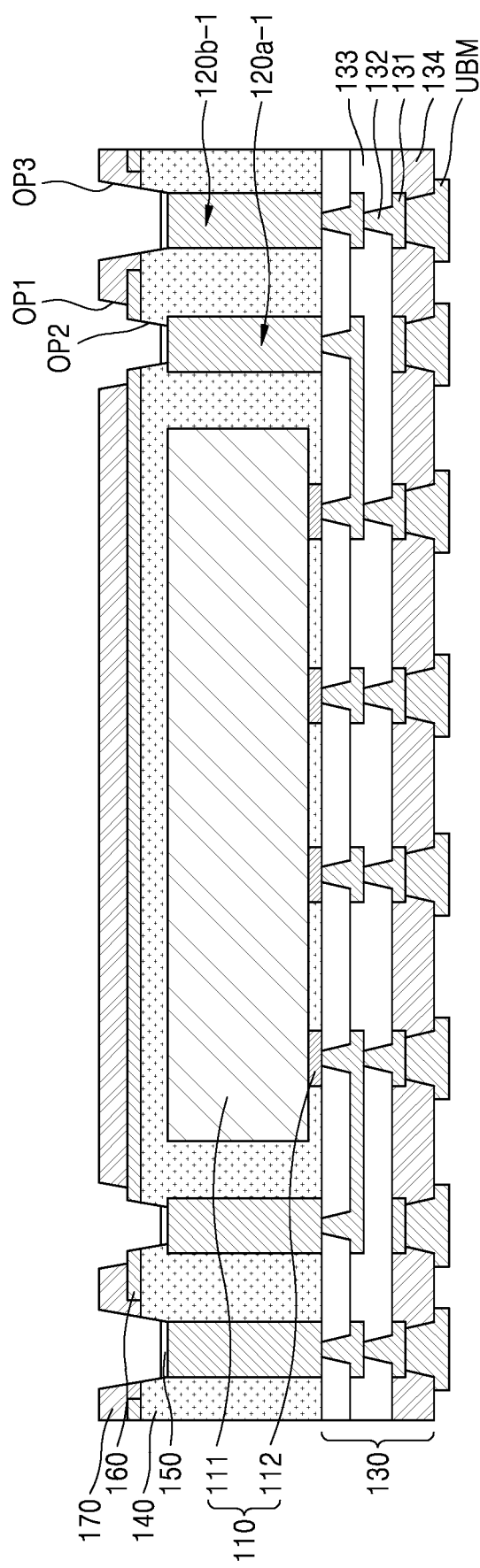

Referring to FIG. 9G, the first opening OP1, the second opening OP2, and the third opening OP3 may be formed. Next, the wetting pad 150 may be formed on the ground connection pattern 120*a*-1 inside the second opening OP2. Also, the wetting pad 150 may be formed on the signal connection pattern 120*b*-1 inside the third opening OP3.

Referring to FIG. 2, the first ground bump 180*a* and the first signal bump 180*b* may be formed on the under-bump metal UBM of the first package substrate 130. As a result, the manufacture of the semiconductor package 100*a* shown in FIG. 2 may be completed.

FIGS. 10A to 10E are cross-sectional views of stages in a method of manufacturing a semiconductor package (refer to 100*b* in FIG. 3), according to an embodiment.

Figure 10A:
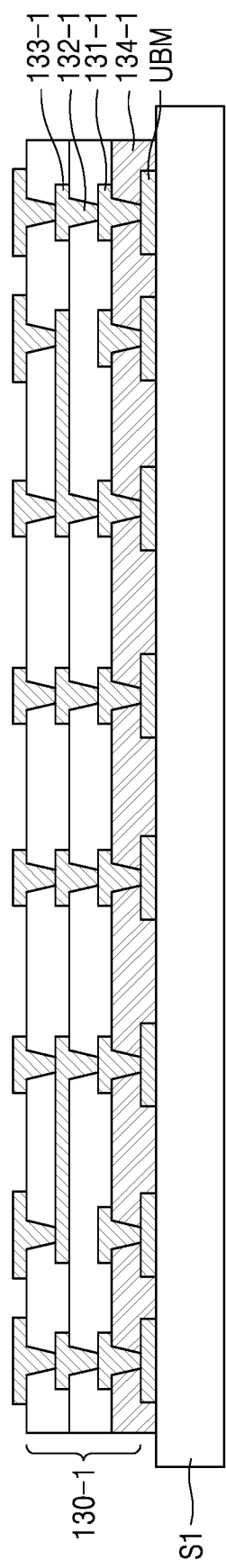
FIGS. 10A to 10E are cross-sectional views of stages in a method of manufacturing a semiconductor package, according to an embodiment.

Referring to FIG. 10A, the first package substrate 130-1 may be manufactured on the first support structure S1. For example, the under-bump metal UBM may be formed on the first support structure S1. The first substrate protective layer 134-1 may be formed on the under-bump metal UBM and the first support structure S1. The first substrate conductive via 132-1 and the first substrate conductive pattern 131-1 may be formed on the first substrate protective layer 134-1. The first substrate insulating layer 133-1 may be formed on the first substrate protective layer 134-1 and the first substrate conductive pattern 131-1.

Figure 10B:
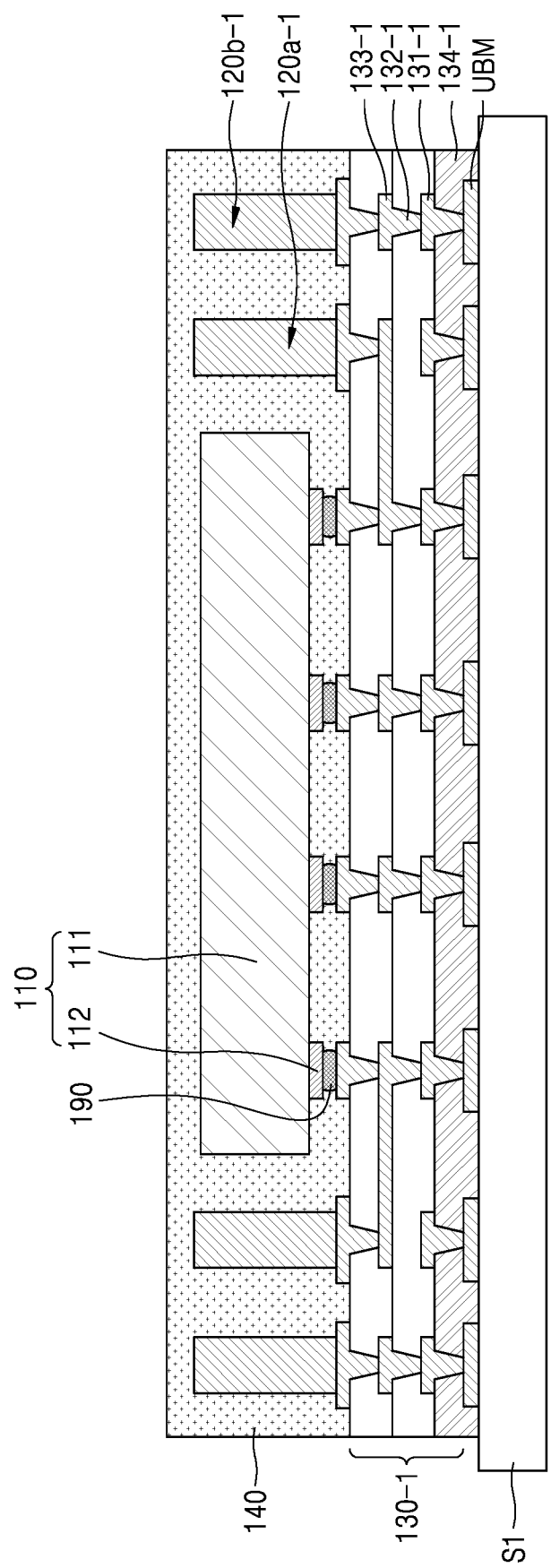

Referring to FIG. 10B, the first semiconductor chip 110 may be adhered to the first package substrate 130-1 by using the chip bump 190. Also, a ground connection pattern 120*a*-1 and a signal connection pattern 120*b*-1 may be disposed on the first package substrate 130-1. Next, a first molding 140 may be formed on the first package substrate 130-1 to cover the first semiconductor chip 110, the ground connection pattern 120*a*-1, and the signal connection pattern 120*b*-1.

Figure 10C:
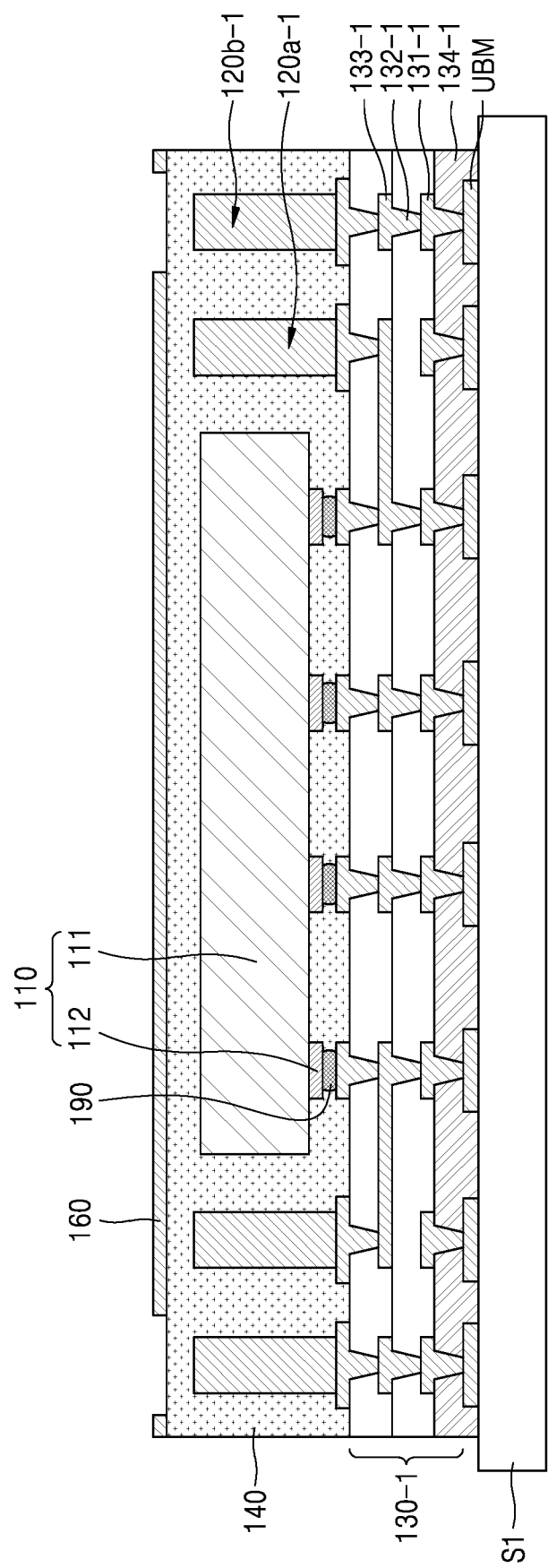

Referring to FIG. 10C, the warpage control layer 160 may be formed on the first molding 140.

Figure 10D:
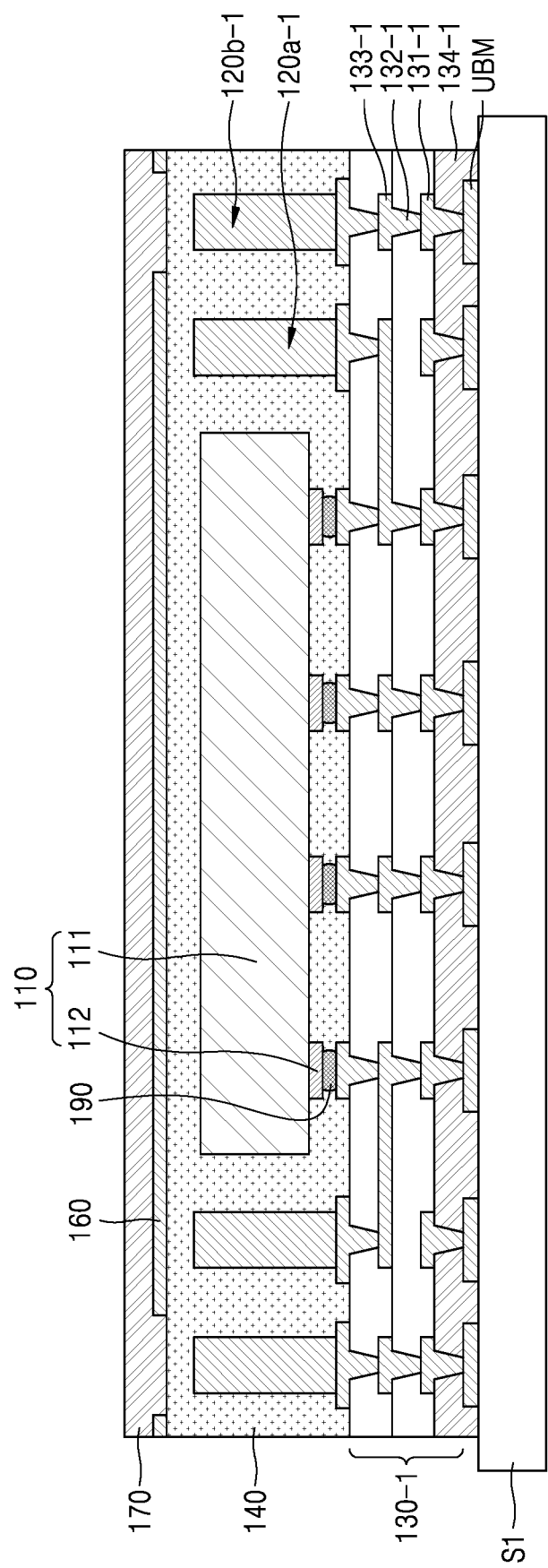

Referring to FIG. 10D, the upper insulating layer 170 may be formed on the warpage control layer 160.

Figure 10E:
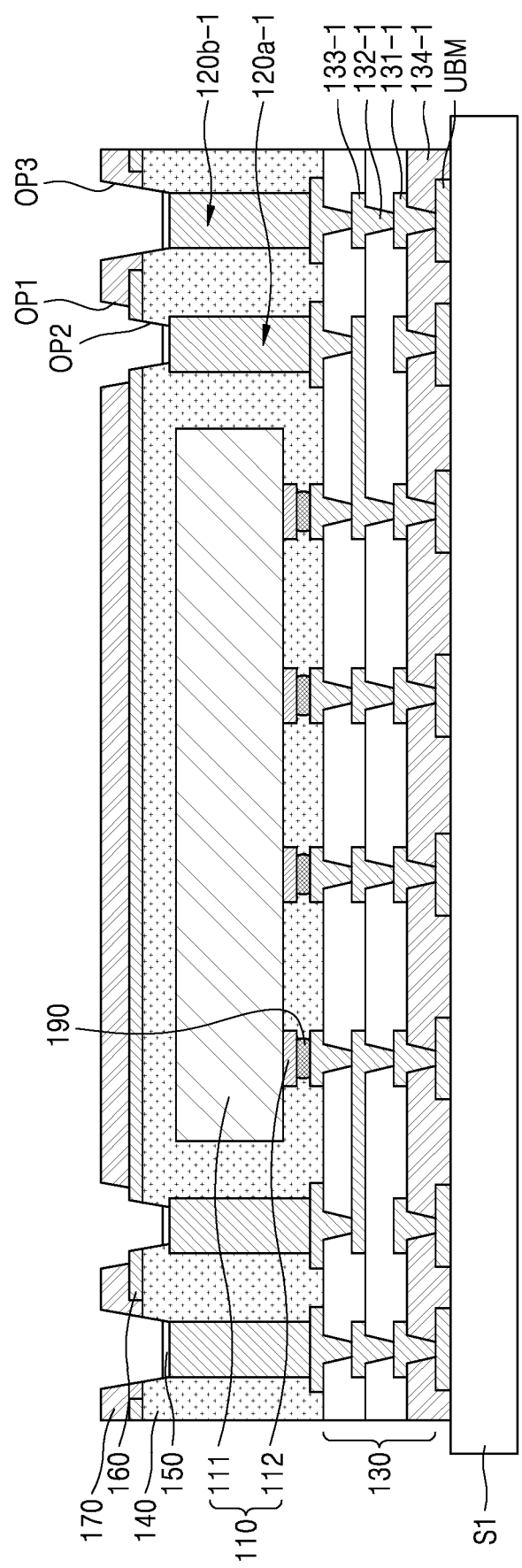

Referring to FIG. 10E, the first opening OP1, the second opening OP2, and the third opening OP3 may be formed. Next, the wetting pad 150 may be formed on the ground connection pattern 120*a*-1 inside the second opening OP2. Also, the wetting pad 150 may be formed on the signal connection pattern 120*b*-1 inside the third opening OP3. Next, the first support structure S1 may be removed from the first package substrate 130-1.

Referring to FIG. 3, the first ground bump 180*a* and the first signal bump 180*b* may be formed on the under-bmp metal UBM of the first package substrate 130-1. As a result, the manufacture of the semiconductor package 100*b* shown in FIG. 3 may be completed.

Referring to FIG. 5, the first sub-package P1 may be prepared using one of the methods described with reference to FIGS. 8A to 8F, FIGS. 9A to 9G, and FIGS. 10A to 10. Also, the second sub-package P2 may be prepared. For example, the second semiconductor chips 210-1 and 210-2 may be adhered to the second package substrate 230, and the second molding 240 may be formed to cover the second package substrate 230 and the second semiconductor chips 210-1 and 210-2. The second ground bump 280*a* and the second signal bump 280*b* may be formed on the second package substrate 230. Next, the second ground bump 280*a* and the second signal bump 280*b* may be coated with flux. Subsequently, the second ground bump 280*a* and the second signal bump 280*b* may be reflowed such that the second ground bump 280*a* is brought into contact with the warpage control layer 160 and the ground connection pattern 120*a*-1, and the second signal bump 280*b* is brought into contact with the signal connection pattern 120*b*-1. As a result, the manufacture of the semiconductor package 200 shown in FIG. 3 may be completed.

By way of summation and review, embodiments provide a semiconductor package, which has excellent electrical characteristics, reduces warpage, and is easy to manufacture. That is, a back-side of a warpage control layer, e.g., a dummy copper layer, may be exposed by a via, and a ground solder ball may be formed in contact with the back-side of the warpage control layer and a ground pad. Accordingly, the warpage control layer may be connected to the ground pad through the ground solder ball, thereby facilitating grounding without a via.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a redistribution structure;
a ground bump and a signal bump on a lower surface of the redistribution structure;
a frame on an upper surface of the redistribution structure, the frame including a ground connection pattern electrically connected to the ground bump and a signal connection pattern electrically connected to the signal bump;
an application processor (AP) chip inside a hole configured to pass through the frame;
a molding on the upper surface of the redistribution structure, the molding covering the AP chip and the frame;
a conductive layer on the molding;
an upper insulating layer on the conductive layer;
a first opening passing through the upper insulating layer and exposing an upper surface of the conductive layer;
a second opening overlapping the first opening in a top view, the second opening passing through the conductive layer and exposing the ground connection pattern; and
a third opening passing through the upper insulating layer and exposing the signal connection pattern.

2. The semiconductor package as claimed in claim 1, wherein the conductive layer is separated from the third opening.

3. The semiconductor package as claimed in claim 1, wherein, in the top view, a portion of the conductive layer exposed by the first opening has an annular shape surrounding the second opening.

4. The semiconductor package as claimed in claim 1, wherein:
   the ground connection pattern is connected to the ground bump through the redistribution structure, the ground connection pattern and the ground bump being electrically grounded, and
   the signal connection pattern is connected to the signal bump through the redistribution structure, the signal connection pattern and the signal bump being configured to transmit signals.

5. The semiconductor package as claimed in claim 1, wherein the molding further covers the ground connection pattern and the signal connection pattern.

6. The semiconductor package as claimed in claim 5, wherein the second opening and the third opening further pass through the molding.

7. The semiconductor package as claimed in claim 1, wherein, a diameter of the first opening at the upper surface of the conductive layer is greater than a diameter of the second opening.

8. The semiconductor package as claimed in claim 1, wherein the conductive layer is separated from the ground connection pattern.

9. The semiconductor package as claimed in claim 1, wherein the conductive layer includes copper.

10. The semiconductor package as claimed in claim 1, wherein a portion of the conductive layer, which is not covered by the upper insulating layer, has an annular shape.

11. A semiconductor package, comprising:
   a first sub-package; and
   a second sub-package on the first sub-package,
   wherein the first sub-package includes:
      a redistribution structure,
      a first ground bump on a lower surface of the redistribution structure,
      a logic chip on an upper surface of the redistribution structure,
      a frame on the upper surface of the redistribution structure, the frame surrounding the logic chip,
      a first molding on the upper surface of the redistribution structure, the first molding covering the logic chip and the frame,
      a dummy conductive layer on the first molding,
      an upper insulating layer on the dummy conductive layer,
      a first opening passing through the upper insulating layer and exposing the dummy conductive layer, and
      a second opening overlapping the first opening in a top view, the second opening passing through the dummy conductive layer and exposing the frame,
   wherein the second sub-package includes:
      a package substrate,
      a second ground bump on a lower surface of the package substrate,
      a memory chip on an upper surface of the package substrate, and
      a second molding on the upper surface of the package substrate, the second molding covering the memory chip, and
   wherein the second ground bump is in contact with the dummy conductive layer and the frame through the first opening and the second opening.

12. The semiconductor package as claimed in claim 11, wherein the second ground bump is in contact with an upper surface of the dummy conductive layer.

13. The semiconductor package as claimed in claim 12, wherein the second ground bump is further in contact with a side surface of the dummy conductive layer through the second opening.

14. The semiconductor package as claimed in claim 11, wherein the frame further includes a ground connection pattern connected to the first ground bump, a signal connection pattern connected to a first signal bump, and an insulating structure surrounding the ground connection pattern and the signal connection pattern.

15. The semiconductor package as claimed in claim 14, further comprising a wetting pad between the second ground bump and the ground connection pattern.

16. The semiconductor package as claimed in claim 14, wherein the first molding further extends between the dummy conductive layer and the insulating structure.

17. The semiconductor package as claimed in claim 11, further comprising a first signal bump on the lower surface of the redistribution structure and a second signal bump on the lower surface of the package substrate.

18. A semiconductor package, comprising:
   a first sub-package; and
   a second sub-package on the first sub-package,
   wherein the first sub-package includes:
      a redistribution structure,
      a first ground bump and a first signal bump on a lower surface of the redistribution structure,
      a logic chip on an upper surface of the redistribution structure,
      a frame on the upper surface of the redistribution structure, the frame surrounding the logic chip, and the frame including a ground connection pattern connected to the first ground bump, a signal connection pattern connected to the first signal bump, and an insulating structure surrounding the ground connection pattern and the signal connection pattern,
      a first molding on the upper surface of the redistribution structure, the first molding covering the logic chip and the frame,
      a dummy conductive layer on the first molding,
      an upper insulating layer on the dummy conductive layer,
      a first opening passing through the upper insulating layer and exposing the dummy conductive layer, and
      a second opening overlapping the first opening in a top view, the second opening passing through the dummy conductive layer and exposing the frame,
   wherein the second sub-package includes:
      a package substrate,
      a second ground bump and a second signal bump on a lower surface of the package substrate,
      a memory chip on an upper surface of the package substrate, and
      a second molding on the upper surface of the package substrate, the second molding covering the memory chip, and
   wherein the second ground bump is in contact with the dummy conductive layer and the frame through the first opening and the second opening.

19. The semiconductor package as claimed in claim 18, wherein the second ground bump is in contact with the ground connection pattern through a first opening passing through the upper insulating layer and a second opening passing through the dummy conductive layer and the first molding.

20. The semiconductor package as claimed in claim 18, wherein the second signal bump is in contact with the signal connection pattern through a third opening passing through the upper insulating layer and the first molding and is separated from the dummy conductive layer.

\* \* \* \* \*